(12) United States Patent
Veenstra et al.

(10) Patent No.: US 6,460,148 B2
(45) Date of Patent: *Oct. 1, 2002

(54) ENHANCED EMBEDDED LOGIC ANALYZER

(75) Inventors: Kerry Veenstra, San Jose; Krishna Rangasayee; Alan L. Herrmann, both of Sunnyvale, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/887,918

(22) Filed: Jun. 21, 2001

Related U.S. Application Data

(63) Continuation of application No. 09/186,607, filed on Nov. 6, 1998, now Pat. No. 6,286,114, which is a continuation of application No. 08/958,435, filed on Oct. 27, 1997, now Pat. No. 6,182,247.

(60) Provisional application No. 60/065,602, filed on Nov. 18, 1997.

(51) Int. Cl.[7] .................................................. G06F 11/25
(52) U.S. Cl. ........................ 714/39; 714/725; 714/739; 703/16
(58) Field of Search ............................... 714/39, 34, 30, 714/725, 733, 734; 703/15, 16, 17, 28; 326/38, 39

(56) References Cited

U.S. PATENT DOCUMENTS

| 4,835,736 A | 5/1989 | Easterday |
| 5,058,114 A | 10/1991 | Kuboki et al. |

(List continued on next page.)

FOREIGN PATENT DOCUMENTS

| DE | 40 42 262 | 7/1992 |

OTHER PUBLICATIONS

Robert R. Collins, "Overview of Pentium Probe Mode, " (www.x86.org/articles/probemd/ProbeMode.htm), Aug. 21, 1998, 3 pages.
Robert R. Collins, "ICE Mode and the Pentium Processor," (www.x86.org/ddj/Nov97./htm), Aug. 21, 1998, 6 pages.
"Pentium® Pro Family Developer's Manual," vol. 1: Specifications, Intel® Corporation, 1996, 9 pages.
Pentium® Processor User's Manual, vol. 1, Intel Corporation ®, 1993, p. 11–3.

*Primary Examiner*—Scott Baderman
(74) *Attorney, Agent, or Firm*—Beyer Weaver & Thomas, LLP

(57) ABSTRACT

Embedding a logic analyzer in a programmable logic device allows signals to be captured both before and after a trigger condition (breakpoint). A logic analyzer embedded within a PLD captures and stores logic signals. It unloads these signals for viewing on a computer. Using an electronic design automation (EDA) software tool running on a computer system, an engineer specifies signals of the PLD to be monitored, a breakpoint, total number of samples to be stored, number of samples to be captured after the breakpoint occurs, and a system clock signal. The EDA tool automatically inserts the logic analyzer into the electronic design of the PLD which is compiled and downloaded to configure the PLD. Using an interface connected between the PLD and the computer, the EDA tool commands the embedded logic analyzer to run. Signals are stored continuously while running in a ring buffer RAM memory. Once the breakpoint occurs, more samples are captured if desired, in addition to those signals captured before breakpoint. The EDA tool directs the logic analyzer to unload the data from its capture buffer for display on a computer. The breakpoint and sample number can be changed without recompiling. A JTAG port controls the logic analyzer. Inputs and outputs of the logic analyzer are routed to unbonded JTAG-enabled I/O cells. Alternatively, a user-implemented test data register provides a JTAG-like chain of logic elements through which control and output information is shifted. Stimulus cells provide control information to the logic analyzer, and sense cells retrieve data from the logic analyzer.

12 Claims, 15 Drawing Sheets

U.S. PATENT DOCUMENTS

| | | |
|---|---|---|
| 5,568,439 A | 10/1996 | Jamal |
| 5,572,712 A | 11/1996 | Jamal |
| 5,640,542 A | 6/1997 | Whitsel et al. |
| 5,717,699 A * | 2/1998 | Haag et al. ............... 371/22.2 |
| 5,764,079 A * | 6/1998 | Patel et al. ................. 326/40 |
| 5,821,771 A | 10/1998 | Patel et al. |
| 5,870,410 A * | 2/1999 | Norman et al. ........... 371/22.2 |
| 5,960,191 A * | 9/1999 | Sample et al. ......... 395/500.49 |
| 6,016,563 A | 1/2000 | Fleisher |
| 6,157,210 A * | 12/2000 | Zaveri et al. ................ 326/40 |
| 6,014,334 A1 | 1/2001 | Patel et al. |
| 6,182,247 B1 * | 1/2001 | Herrmann et al. ........... 714/39 |
| 6,020,758 A1 | 2/2001 | Patel et al. |
| 6,223,148 B1 * | 4/2001 | Stewart et al. .............. 703/25 |
| 6,247,147 B1 * | 6/2001 | Beenstra et al. ............. 714/39 |
| 6,259,271 B1 * | 7/2001 | Couts-Martin et al. ....... 326/40 |
| 6,286,114 B1 * | 9/2001 | Veenstra et al. ............. 714/39 |

* cited by examiner

ENHANCED EMBEDDED LOGIC ANALYZER

This application claims priority of U.S. provisional patent application No. 60/065,602, filed Nov. 18, 1997, entitled "Enhanced Embedded Logic Analyzer" which is incorporated by reference. This application is a continuation of U.S. patent application Ser. No. 09/186,607 filed Nov. 16, 1998 now U.S. Pat. No. 6,286,114, which in turn is a continuation-in-part of U.S. patent application Ser. No. 08/958,435, filed Oct. 27, 1997 now U.S. Pat. No. 6,182,247, entitled "Embedded Logic Analyzer For A Programmable Logic Device" which is incorporated by reference.

This application is related to U.S. Pat. No. 6,247,147, entitled "Enhanced Embedded Logic Analyzer," which is hereby incorporated by reference.

FIELD OF THE INVENTION

The present invention relates generally to analysis of a hardware device in connection with a computer system. More specifically, the present invention relates to a logic analyzer that is automatically embedded within a hardware device for purposes of debugging.

BACKGROUND OF THE INVENTION

In the field of electronics, various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

In the course of generating a design for a PLD, programming the PLD and checking its functionality on the circuit board or in the system for which it is intended, it is important to be able to debug the PLD because a design is not always perfect the first time. Before a PLD is actually programmed with an electronic design, a simulation and/or timing analysis may be used to debug the electronic design. However, once the PLD has been programmed and is operating within a working system, it is also important to be able to debug the PLD in this real-world environment.

And although a simulation may be used to debug many aspects of a PLD, it is nearly impossible to generate a simulation that will accurately exercise all of the features of the PLD on an actual circuit board operating in a complex system. For example, a simulation may not be able to provide timing characteristics that are similar to those that will actually be experienced by the PLD in a running system; e.g., simulation timing signals may be closer or farther apart than what a PLD will actually experience in a real system.

In addition to the difficulties in generating a comprehensive simulation, other circuit board variables such as temperature changes, capacitance, noise, and other factors may cause intermittent failures in a PLD that are only evident when the PLD is operating within a working system. Still further, it can be difficult to generate sufficiently varied test vectors to stress the PLD design to the point where most bugs are likely to be observed. For example, a PLD malfunction can result when the PLD is presented with stimuli that the designer did not expect, and therefore did not take into account during the design and simulation of the PLD. Such malfunctions are difficult to anticipate and must be debugged in the context of the complete system. Thus, simulation of an electronic design is useful, but usually cannot debug a PLD completely.

One approach to debugging a hardware device within a working system is to use a separate piece of hardware equipment called a logic analyzer to analyze signals present on the pins of a hardware device. (For example, the HP1670A Series Logic Analyzer from Hewlett-Packard Company.) Typically, a number of probe wires are connected manually from the logic analyzer to pins of interest on the hardware device in order to monitor signals on those pins. The logic analyzer captures and stores these signals. However, the use of an external logic analyzer to monitor pins of a hardware device has certain limitations when it comes to debugging such a device. For example, such an external logic analyzer can only connect to and monitor the external pins of the hardware device. Thus, there is no way to connect to and monitor signals that are internal to the hardware device. Unfortunately, when programming a hardware device such as a PLD, it would be useful to be able to monitor some of these internal signals in order to debug the PLD.

Although some custom hardware devices may come ready made with some internal debugging hardware, this debugging hardware is typically hardwired to route specific internal signals and cannot be readily changed by an engineer who wishes to look at other signals. Also, with such built-in debugging it is not possible to choose any signal to monitor that the engineer desires, nor can triggering signals and triggering conditions be changed by the engineer. Because a PLD by its very nature is a programmable device that an engineer is attempting to program to perform a particular function, it is important to the engineer to be able to customize monitored signals, trigger signals, and trigger conditions in order to efficiently debug any particular device. Further, creating an electronic design for a PLD is an iterative process that requires creative debugging by an engineer who may wish to view almost any internal signal, and who may change his mind fairly frequently in the course of debugging a PLD within a system. Known external and internal logic analyzers do not provide this flexibility.

A further drawback to using an external logic analyzer or hardwired predetermined debugging hardware inside of a custom chip is that often the number of internal signals that an engineer desires to monitor are greater than the number of available pins on the device. For example, if there are sixteen internal signals that an engineer wishes to monitor on a device, he is unable to do this using an external logic analyzer if the device has only four pins available for debugging.

In some cases, it is possible for an engineer to employ a conventional logic analyzer to study an internal signal of a PLD. This may be accomplished by, for example, an engineer modifying his design so that a normally internal signal is routed temporarily to an output pin of the PLD. The design is then recompiled. The engineer then attaches a probe to this output pin in order to monitor the "internal" signal. Unfortunately, the engineer must recompile his design and reprogram the PLD in order to view this internal signal.

Also, when debugging is complete, the engineer must again rewrite the design to remove the internal signal from the output pin, recompile the design and fully reprogram the PLD again. This can be a tedious process.

Even if an engineer is successful in routing an internal signal to an output pin of a PLD, with certain integrated circuit packages it may be extremely difficult to attach an external logic analyzer. For an integrated circuit in a dual in-line package it may be relatively straightforward to attach the probes of a logic analyzer to the top of the package as long as the package is in an easily accessible location on a circuit board. However, if the package is in a difficult to reach location because of device crowding, it may be difficult to physically attach logic analyzer probes to particular output pins of interest. Even more troublesome are integrated circuits with rows of miniature contacts located on the top of the package (e.g., "flip chips"). It is difficult to attach logic analyzer probes to particular outputs of interest with this type of package. Some integrated circuit are encased in a ball grid array package with the contacts located on the bottom of the package up against the circuit board; for these packages, it may be nearly impossible to attach logic analyzer probes to these small contacts located on the underside of the package. Thus, use of an external logic analyzer has shortcomings even if an internal signal can be routed to a pin of a device.

U.S. patent application Ser. No. 08/958,435 entitled "Embedded Logic Analyzer For A Programmable Logic Device" discloses an advantageous apparatus and techniques that allow an embedded logic analyzer to flexibly analyze internal signals of interest in an electronic design, such as within a programmable logic device (PLD). Nevertheless, there is room for improvement in the analysis of internal signals of a PLD for debugging purposes.

For example, some logic analyzers allow a user to specify a trigger condition and a set of trigger signals that must satisfy that trigger condition before the logic analyzer is triggered into the capture of data. Such logic analyzers are useful when it is desirable to capture and analyze signal data that occurs immediately after a particular trigger condition (such as a failure of the device). It is often desirable, however, to capture signals for later analysis that occur before the trigger condition. For the most part, these logic analyzers that begin data capture based upon satisfaction of a trigger condition are unable to provide captured signals before the trigger condition because the logic analyzer is only designed to begin capture upon an error, failure or other trigger condition. Because these errors and/or failures are unanticipated, these type of logic analyzers are unable to anticipate the trigger condition, and hence, are unable to begin capturing data before the trigger condition occurs.

In some debugging situations, it can be extremely advantageous to capture signals that occur before the trigger conditions occurs. For example, when debugging a PCI bus interface, a situation may occur in which the interface enters an illegal state. Traditional logic analyzers would be able to detect that illegal state and immediately begin capturing signal data for later analysis. It would be extremely desirable, however, to begin capturing signal data before the bus interface enters the illegal state in order to determine why the bus has entered this illegal state. In another example, when an interrupt occurs, it can be extremely desirable to know the history of certain registers before the interrupt occurs. In other words, once the interrupt is received, data capture may begin, but the registers may already be in an incorrect state. It would be extremely desirable to be able to capture and analyze signal data before the interrupt occurs in order to determine why certain registers are in an incorrect state when the interrupt occurs. Other situations in which it would be desirable to capture signal data before a specific trigger condition are also possible.

Various prior art efforts present partial solutions, but each have their drawbacks. For example, external logic analyzers available from the Hewlett-Packard Company allow capture of signal data before a trigger condition (or breakpoint) occurs. Unfortunately, these external logic analyzers suffer from many of the disadvantages associated with external logic analyzers discussed above. Actel Corporation of Sunnyvale, Calif. provides two probes within a programmable logic device that are able to monitor two different signals, but these signals must be prespecified by the user and may not be flexibly reassigned to other signals. In addition, the Actel probes provide constant monitoring of particular signals, but do not allow capture of relevant signal data in relation to a specified breakpoint.

Therefore it would be desirable to have an apparatus and technique that would allow a logic analyzer embedded within a programmable logic device to flexibly capture internal signals both before and after a specified breakpoint.

Furthermore, it would be desirable to have an apparatus and technique that would efficiently and flexibly control a logic analyzer embedded within a programmable logic device. As explained below, although various options are available for controlling such an embedded logic analyzer, none of the prior art techniques are optimal. By way of background, a brief explanation of the design and manufacturing phases of a PLD and a circuit board will be provided first.

As described earlier in this section, a design engineer designs a PLD and programs such a device using an electronic design automation tool. In the course of this design phase, the design engineer may perform numerous design-program-debug iterations before the design is complete and the PLD ready for mass manufacturing. The design engineer often uses a simulation and/or a timing analysis to assist in debugging the electronic design of the PLD. It is also conceivable that a design engineer would use an embedded logic analyzer (such as disclosed in U.S. patent application Ser. No. 08/958,435) to troubleshoot the design. Once the design of the PLD is complete to the design engineer's satisfaction, the design is handed off to a product engineer for the manufacturing phase.

In the manufacturing phase, a product engineer designs a manufacturing flow for the mass production of an electronic circuit board or other electronic device that incorporates one or more PLDs. During the manufacturing phase, it will be necessary to test the board itself and may also be necessary to retest the PLD. In the beginning of the manufacturing phase, any number and type of hardware components and any number of PLDs are soldered to a board. Once on the board, a PLD is most often programmed (or configured) using a JTAG port located on the PLD. It is also possible that a particular PLD be programmed by itself before placement on a board using a special socket and a programming unit.

A full board test may then be performed to test the traces, solder connections, and other physical interfaces between components on the board. It should be pointed out that a board test may also be performed before any devices on the board are programmed or configured. It is common to use a JTAG port of a PLD or other device to test the traces and solder connections of a board during this board test. Once physical connections are tested, a complete functional test of the board is then formed to test the overall functionality of the board (i.e., to ensure that particular inputs produce the outputs expected). At this point, if a failure is detected it may be necessary to debug a particular PLD while on the board. For failures more difficult to track down, it may even be necessary to remove a PLD from the board to be debugged. In these circumstances, as previously explained, it is desirable to have an embedded logic analyzer within the PLD to facilitate debugging. During any debugging of the PLD using an embedded logic analyzer, it is necessary in some fashion to control the embedded logic analyzer, i.e., to provide it with commands and data and to receive captured data and status from it. Although various options are available, none are currently optimal.

For example, it may be possible to use existing input/output pins of a device to provide a control interface. Unfortunately, a particular design may not have enough extra input/output pins available through which an interface can be provided to control an embedded logic analyzer. It can be undesirable to require that a customer purchasing a PLD not use a certain number of input/output pins simply because the PLD may not have been designed correctly and might have to be debugged at some point.

Intel Corporation of Santa Clara, Calif. uses a JTAG port to control access to specified debug registers for help in debugging a central processing unit (CPU). Because a CPU is a known design, it is known beforehand exactly how many debug registers will be needed and control is simpler. With a PLD, however, each user-implemented design will be custom; it is unknown ahead of time what that design will be and how many debug registers might be needed. Different designs will require different debug registers. Thus the straightforward technique used by Intel with a known design of a CPU would not be appropriate with a PLD.

Therefore, an apparatus and technique are further desirable that would provide simple, efficient and flexible control of an embedded logic analyzer. It would further be desirable for such a control apparatus and technique to allow testing of a PLD on a circuit board in a real-world environment.

SUMMARY OF THE INVENTION

To achieve the foregoing, and in accordance with the purpose of the present invention, a technique for embedding a logic analyzer in a programmable logic device is disclosed that allows capture of specified signal data both before and after a specified breakpoint. Also disclosed are techniques for controlling an embedded logic analyzer using a JTAG port.

The present invention provides both an apparatus and a technique by which a logic analyzer circuit is automatically embedded within a PLD, by which it captures and stores logic signals both before and after a breakpoint, and by which it unloads these signals through an interface to a computer. In a preferred embodiment, analysis of the signals is performed on the computer, with the "on-chip" logic analyzer circuit serving only to acquire the signals. The invention works especially well with a PLD because, by its very nature, a PLD is able to be programmed with a design, the design may be changed, and the PLD programmed again and again. Thus, the logic analyzer circuit may be embedded in test designs or iterations in the process of designing a final PLD. Upon successful debugging of the PLD design, the PLD chip can be reprogrammed without the logic analyzer circuit, or the circuit can be left on the chip.

In one embodiment of the invention, using an electronic design automation (EDA) software tool running on a computer system, an engineer specifies signals of the PLD to be monitored, specifies the number of samples to be captured, specifies a system clock signal, and specifies not only a breakpoint, but also the number of samples needed prior to the breakpoint. (Alternatively, total samples could be specified and/or samples needed after a breakpoint.) The EDA tool then automatically inserts the logic analyzer circuit into the electronic design of the PLD which is compiled and downloaded to configure the PLD. Using an interface connected between the PLD and the computer, the EDA tool communicates with the embedded logic analyzer in order to instruct the logic analyzer to run and to begin capturing data. Once a breakpoint occurs, the logic analyzer determines if more samples need to be captured after the breakpoint. The EDA tool then directs the logic analyzer to unload the data from sample memory and then displays the data on the computer. The logic analyzer circuit may then run again to capture another sequence of sample values.

In one specific embodiment of the invention, the logic analyzer captures data from specified signal lines continuously in a ring buffer, or similar memory structure that overwrites earlier stored data when full. In this fashion, relevant data is stored continuously before a breakpoint occurs, thus, the stored data may be viewed later by a user who wishes to view signals occurring before the breakpoint. Once the breakpoint occurs, a counter keeps track of how many additional samples of data (if any) need be collected.

Often, a JTAG port is used either to program a PLD or to assist with testing a circuit board on which PLDs are located. Advantageously, it is realized that a JTAG port has traditionally been unused during the design and debugging of a particular PLD. Thus, it is further realized that a JTAG port on a PLD is under utilized and may be used during debugging of a PLD as a means of communicating with and controlling an embedded logic analyzer of the present invention. Advantageously, the standard JTAG port is used to facilitate debugging of a programmable logic device that includes an embedded logic analyzer. Use of a JTAG port avoids adding dedicated debugging control pins. In a first embodiment for controlling an embedded logic analyzer using a JTAG port, inputs and outputs of the logic analyzer are routed to unbonded JTAG-enabled I/O cells. Cells that will provide control signals are tricked into thinking they are in INTEST mode so that signals may be input, yet the rest of the device operates as in a real-world environment. In a second embodiment, a user-implemented test data register provides a JTAG-like chain of logic elements through which control and output information is shifted. Stimulus cells provide control information to the logic analyzer, and sense cells retrieve data from the logic analyzer.

The present invention provides many advantages over the prior art. Use of an embedded logic analyzer in a PLD allows debugging of the device in the system in which it is operating and under the actual conditions that might produce a malfunction of the PLD. The technique of the present invention automatically embeds a logic analyzer circuit into a PLD so that an engineer may debug any logic function within the device. The embedded logic analyzer is able to capture any internal signals specified by the engineer; the breakpoint can also include any specified internal signals. Through the use of memory within the embedded logic analyzer and an interface to the computer, any number and depth of signals can be monitored within the device and then transmitted to the computer at a later time for analysis. In one embodiment of the invention, a JTAG port is used to program the embedded logic analyzer and to transmit captured signal information to the computer.

Advantageously, while debugging a PLD design in a system, an engineer may use the EDA tool to specify new signals to monitor and/or new breakpoints. The engineer can then reprogram the device while it is within its intended system with a modified logic analyzer circuit very rapidly in order to debug a different portion of the device or to change the triggering conditions. This ability to reprogram an embedded logic analyzer on the fly has many advantages over built-in debugging hardware on custom chips that may not be dynamically reprogrammed. This ability to reprogram also has advantages over external logic analyzers that can only monitor the external pins of a hardware device. Furthermore, once an engineer has finished debugging the device with the embedded logic analyzer, the EDA tool may be used to generate a final configuration output file without the logic analyzer that represents the engineer's final working design. Thus, the logic analyzer need not be part of the final design and take up space on the PLD.

The present invention is applicable to a wide range of hardware devices, and especially to PLDs. A PLD in particular may be implemented using a wide variety of technologies, including SRAM technology and EEPROM technology. PLDs based upon SRAM technology are especially advantageous in that they may have additional embedded memory that can be used by the embedded logic analyzer to capture a large number of, and a greater depth of signals. Furthermore, an embedded logic analyzer that is designed and inserted automatically by an EDA tool means that an engineer does not require an external logic analyzer as a separate piece of equipment. Furthermore, the engineer may use the computer on which he or she is creating a design for the PLD to also control and configure the embedded logic analyzer and to review its results.

In one embodiment of the present invention, a number of pins on the PLD are dedicated interface pins for communication with the user computer. Because these pins are dedicated for the interface, and are known ahead of time, they may be routed to an easily accessible location or port on a circuit board, such that a debugging interface cable may be connected from the user computer to these pins extremely easily. This technique is especially advantageous where pins or contacts of a particular integrated circuit in a package may be difficult or nearly impossible to reach. Because the embedded logic analyzer of the present invention may be configured to monitor any internal or external signals of the PLD, all of these monitored signals are available for analysis through these interface pins. In other words, it is not necessary to physically connect a probe to a particular external pin of interest because any signal within the PLD can be monitored, stored within the memory of the embedded logic analyzer and then later uploaded to the user computer for analysis through these dedicated interface pins.

Additionally, an embedded logic analyzer can be used with PLDs that are configured to near capacity. An engineer can temporarily remove a portion of the design unrelated to the problem under analysis, embed a logic analyzer circuit, and then debug the PLD. Once the PLD has been debugged, the engineer may then remove the embedded logic analyzer and reinsert that section of the design that he had temporarily removed.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

In order to develop a design for programming an electronic design such as a programmable logic device (PLD), a programmable logic development system is used. As used herein, "electronic design" refers to circuit boards and systems including multiple electronic devices and multi-chip modules, as well as integrated circuits. For convenience, the following discussion will generally refer to "integrated circuits", or to "PLDs", although the invention is not so limited.

Programmable Logic Development System

Figure 1:
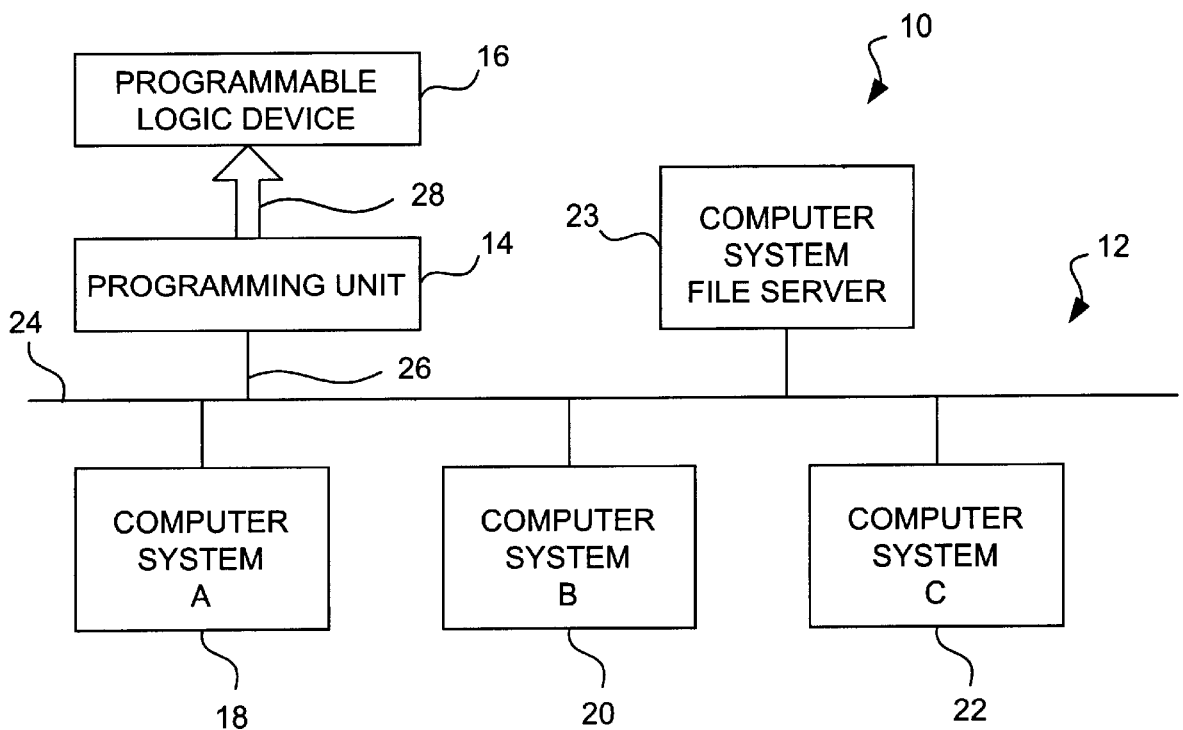
FIG. 1 is a block diagram of a programmable logic development system according to one embodiment of the present invention.

FIG. 1 is a block diagram of an embodiment of a programmable logic development system 10 that includes a computer network 12, a programming unit 14 and a programmable logic device 16 that is to be programmed. Computer network 12 includes any number of computers connected in a network such as computer system A 18, computer system B 20, computer system C 22 and computer system file server 23 all connected together through a network connection 24. Computer network 12 is connected via a cable 26 to programming unit 14, which in turn is connected via a programming cable 28 to the PLD 16. Alternatively, only one computer system could be directly connected to programming unit 14. Furthermore, computer network 12 need not be connected to programming unit 14 at all times, such as when a design is being developed, but could be connected only when PLD 16 is to be programmed.

Programming unit 14 may be any suitable hardware programming unit that accepts program instructions from computer network 12 in order to program PLD 16. By way of example, programming unit 14 may include an add-on logic programmer card for a computer, and a master programming unit, such as are available from Altera Corporation of San Jose, Calif. PLD 16 may be present in a system or in a programming station. In operation, any number of engineers use computer network 12 in order to develop programming instructions using an electronic design automation software tool. Once a design has been developed and entered by the engineers, the design is compiled and verified before being downloaded to the programming unit. The programming unit 14 is then able to use the downloaded design in order to program PLD 16.

For the purposes of debugging a PLD according to an embodiment of the present invention, any of the computers shown or others may be used to specify a logic analyzer circuit and to compile such circuit along with a user's design. Furthermore, programming cable 28 may be used to control the logic analyzer and to receive data from it, or a separate debugging cable may be used to directly connect a computer with device 16.

Such a programmable logic development system is used to create an electronic design. Design entry and processing occurs in the context of a "project". A project includes a project file, design files, assignment files, and simulation files, together with hierarchy information, system settings, and output files, which includes programming files and report files. A project database may also exist, which contains intermediate data structures and version information.

A project contains one or more hierarchies of design entities and each design hierarchy tree has a root entity, which is the topmost design entity in that hierarchy tree (the top-level functional block). Other design entities in the design hierarchy tree are called child entities. Also, a design hierarchy may contain entities for which there is no corresponding design file, for example, in a top-down design methodology. That part of a hierarchy which contains such not-yet-implemented entities is not compiled or simulated until a design file is supplied for each entity. In this case, template source files are automatically generated which have defined interfaces but empty bodies to assist in implementing these parts of a project. A user creates a design by specifying and implementing functional blocks, as will now be described in the context of an exemplary design methodology.

Design Methodology

Figure 2:
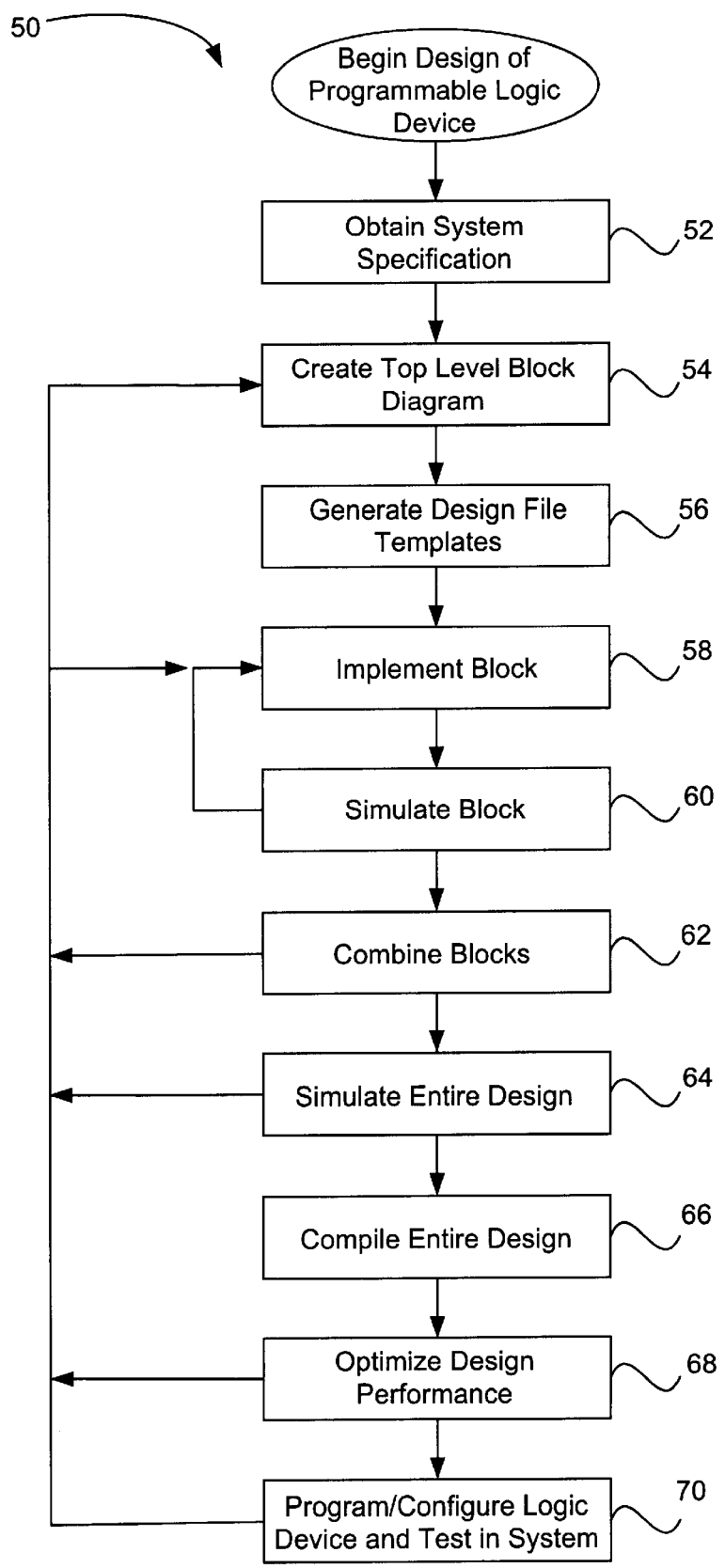
FIG. 2 is a flowchart of a design methodology used to design a programmable logic device according to one embodiment of the present invention.

FIG. 2 shows a design methodology 50 for using a system design specification in order to develop a design with which to program a PLD. It should be appreciated that the present invention may be practiced in the context of a wide variety of design methodologies. By way of example, the work group computing techniques and system of the present invention work well with an electronic design automation (EDA) software tool within the framework of the methodology of FIG. 2.

In step 52 a system specification for the PLD to be programmed is obtained. This specification is an external document or file that describes, for example, the device pin names, the functionality of each of the pins, the desired system functionality, timing and resource budgets, and the like. The multiple engineers within a work group will use this system specification in order to create a design with the EDA tool that will then be used to program a PLD.

Once the system specification is obtained, creation of a design using functional block diagrams is begun. In step 54 a top-level block diagram is created in which connections between lower-level designs blocks are specified. In this block, the target device, speed grade, and key timing requirements may be specified. Those skilled in the art will recognize that this top-level block may also include blocks that have already been developed or implemented or that have been obtained from a third party provider. This top-level block may also be converted into an HDL file, or the like, for use in other related design tools, such as an external simulator.

Step 56 includes generating design file templates with the EDA tool for all blocks present in the top-level block diagram of step 54. After the designer has created a block which has not yet been implemented, the system may generate a design file template. Such templates may display a block in a window format including, for example, a title, a date, etc. around the boundaries. It may also include some details of the functional content depicted within the window. The design file templates may be in any specified design format including VHDL, AHDL, Verilog, block diagram, schematic, or other like format. In the case of a VHDL block the template may also include much of the formatting and necessary syntax for any VHDL block. The user need only take the template and add the small portion of VHDL syntax required to implement his function. For example, the user may need only add syntax defining a particular AND gate operation. Normal design, such as VHDL or other IEEE standard, requires large amounts of text to adequately set up the design block.

Those skilled in the art will recognize that design file templates such as these can be used as starting points for the design of the structural or functional entities needed by the design. Thus, a design file template may serve as a reusable object for different instances of a block in one or more designs. More importantly, design file templates will be employed to reduce the amount of labor that the designer must expend to generate the logic in the blocks. In one embodiment, the generation of the design file templates is done in such a way that the templates can be updated later if the top-level block diagram changes.

Next, in step 58, each of the blocks of the top-level block is implemented using the EDA tool. It is noted that for more complicated designs, there may be additional levels of block diagrams (i.e., blocks within blocks). If changes are required at the top-level then the top-level block diagram is updated and the sub-designs are preferably automatically updated as well.

Furthermore, a block may be compiled through to a fitting stage for a particular integrated circuit die to provide information about resource utilization, timing performance, etc., as required for a given design. As such, it is envisioned that some timing optimization may be performed during step 58. This sequence illustrates a style of design in which an engineer first designs, then compiles and simulates, and then returns to design again if the simulation results are not satisfactory. In another style, an engineer may iterate through a number of design followed by simulation loops before finally compiling the complete design.

Concerning block implementation order, one or more of the following factors can be used to determine implementation order: (1) the complexity of a block; (2) the uncertainty or risk associated with a block; and/or (3) how far upstream and/or downstream in a given data-path the block resides. Each of steps 60, 62, 64, 68 and 70 may also lead back to this block implementation step for additional implementation necessitated by later changes in the design.

In step 60 a block is simulated functionally at the source level using a behavioral simulator and vectors generated by using a VHDL or Verilog test bench, for example. The simulation results can then be displayed or otherwise presented/recorded as waveforms, text or annotated onto the source files. The designer may also return to step 58 to implement a block again. Also, at this point a block may be compiled or a timing analysis performed.

Once the designer is satisfied with the simulation results, in step 62 the block is combined with other blocks and the resulting group is simulated together. In some cases, it may be useful to complete a full compilation to provide critical resource and timing information. Also, output simulation vectors from one block may become the input simulation vectors to the next block. The designer may also return to step 54 to modify the top-level block or to step 58 to implement a block again.

Next, in step 64, the entire design is simulated functionally at the source level using a behavioral simulator. Preferably, the top-level block diagram is fully specified before simulation and shows complete design connectivity. Vectors can be generated using a VHDL or Verilog test bench. Again, the simulation results can be displayed either as waveforms or annotated onto the source files. The designer may also return to step 54 to modify the top-level block or to step 58 to implement a block again. In step 66 the entire design is compiled through to a file containing the information needed to program a PLD to implement the user's design, such as to a "programming output file".

A wide variety of compile techniques may be used depending upon the type of design being created. By way of example, a few examples of compilation are presented below. For a PLD, compilation includes the steps of synthesis, place and route, generation of programming files and simulation. For a traditional integrated circuit design with a custom layout, compilation includes a layout version schematic, a design rule checker and simulations. For integrated circuit design using a high level design tool, compilation includes synthesis from a language such as VHDL or Verilog, automatic place and route and simulations. For printed circuit boards, compilation includes automatic routing, design rule checking, lumped parameter extraction and simulation. Of course, other types of compilation and variations on the above are possible.

Within the context of the present invention, any of the above compile techniques may be modified in order to produce an embedded logic analyzer. As will be discussed in greater detail below with reference to FIG. 4, the compilation of a PLD is modified in order to insert a logic analyzer into a user's design.

Following compilation in step 66, in step 68 the timing checker inside the compiler is used to determine if the performance goals for the design have been met. Also, timing simulations are used to check performance details. In addition, other analysis tools such as a design profiler and/or layout editor can be used to further optimize the performance of the design. Preferably, optimization is not performed prior to step 68 because full compilation is usually required to establish the location of one or more critical paths within the design. The designer may also return to step 54 to modify the top-level block or to step 58 to implement a block again.

Next, in step 70 the device is programmed/configured using programming unit 14 and tested in the system. Again, the designer may also return to step 54 to modify the top-level block or to step 58 to implement a block again. While methodology 50 presents a top-down design process, it may also be used to support a bottom-up type methodology. Now that a general design methodology has been described by which an engineer may develop a design for a PLD, a technique for embedding a logic analyzer within a PLD will now be discussed.

Embedded Logic Analyzer

Figure 3A:
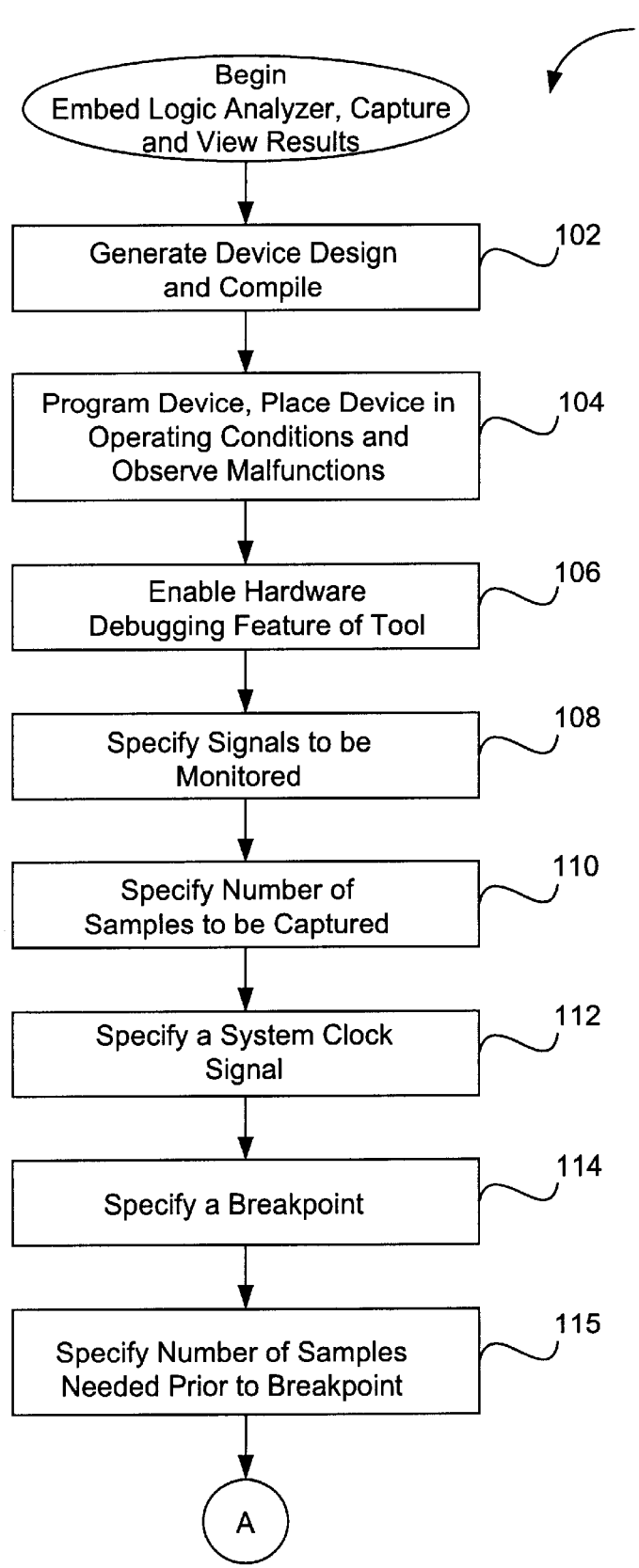
FIGS. 3A and 3B are a flowchart describing one technique by which a logic analyzer is programmed, embedded within a device, captures data and dumps data for viewing by a user.
Figure 3B:
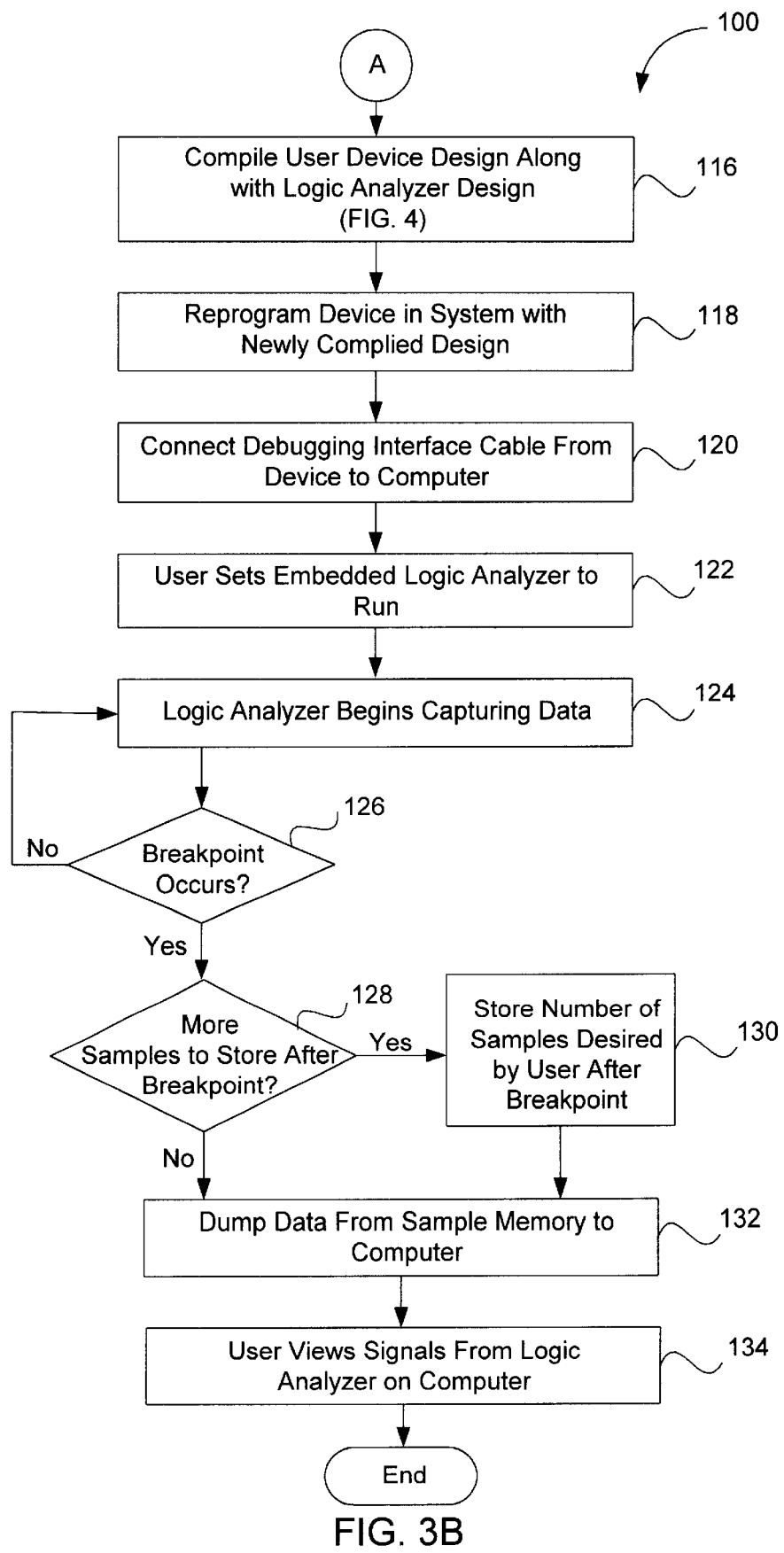

The flowchart of FIGS. 3A and 3B describe one possible technique by which a user may utilize the present invention in order to embed a logic a nalyzer within a PLD to capture desired signals and to view the results on a computer. In step 102 a user generates a design for a device and compiles the design into an output file. A wide variety of EDA tools may be used to generate and compile a design for a PLD. By way of example, the technique disclosed in U.S. patent application No. 60/029,277 may be used.

In step 104, the compiled output file is used to program the device and the device is placed under operating conditions, such as on a printed circuit board or within a suitable electronic system. At this step, a user may observe malfunctions with the device. If so, then in step 106 a hardware debugging feature of the EDA tool is enabled. This enablement will allow the EDA tool to perform netlist augmentation. That is, the user's design in various design files will be augmented with a logic analyzer according to one embodiment of the present invention and is described in greater detail in FIG. 4. This debugging feature also allows the combined netlist to be processed and programmed onto the device.

Figure 8:
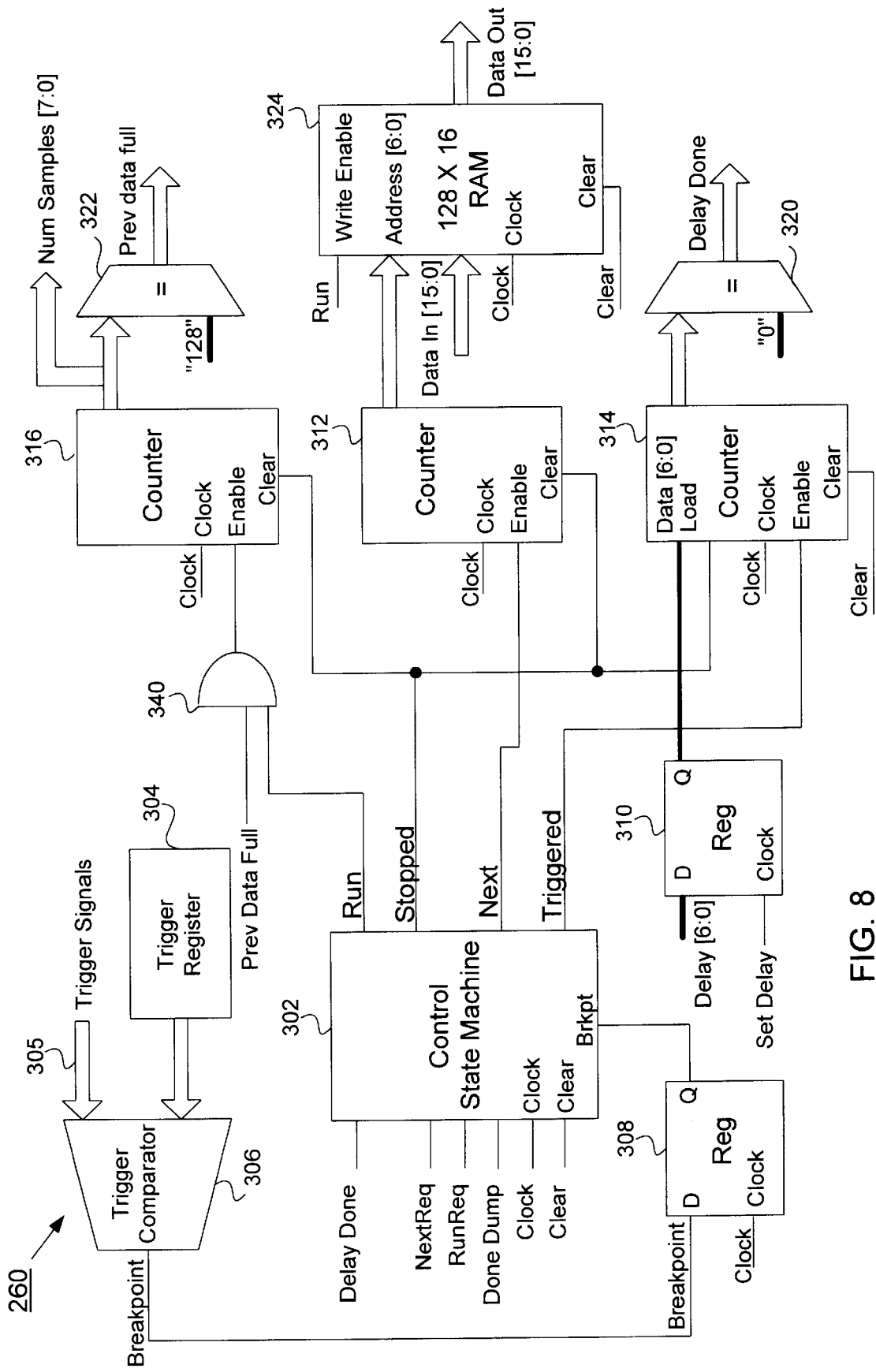
FIG. 8 is a block diagram of an embedded logic analyzer circuit according to one embodiment of the present invention.

Next, the user is allowed to program the logic analyzer in order to debug the device in any way that the user chooses. One example of a logic analyzer circuit is shown in FIG. 8; the design for the logic analyzer may already be present within the EDA tool, or may be generated at any time. In step 108, the signals of interest of the device to be monitored are specified. These are the signals that a user wishes to view in order to track down the cause of the malfunction. The signals may be those present on pins of the device, or any internal signals or points within the device. Often the nature of the malfunction observed in step 104 will provide a clue, suggesting signals that would likely provide further information about the problem. For example, if the malfunction is associated with data output at a particular pin, the signals to be monitored may be provided by logic upstream from the pin.

These signals to be monitored may be specified in a wide variety of ways. By way of example, a hierarchical path name for each signal may be specified, or a graphical user interface may be used to view a particular design file and to select a signal or point from within that file to be monitored. In one alternative embodiment, the user may also specify which pins of the device will be used as an interface to the user computer, i.e., those pins to be used to send control information to the embedded logic analyzer within the PLD and to upload captured information from the logic analyzer to the user computer. Preferably, though, the pins to be used as an interface are already known, such as a JTAG port of a device.

In step 110, the total number of samples to be captured are specified. In other words, the depth of the sample memory is specified and this, in turn, indicates on how many clock pulses data will be acquired by the logic analyzer. The total number of samples to be captured includes all samples to be captured whether before or after a specified breakpoint. In other words, the specified number indicates a width of a window of data to be captured; the window may encompass the breakpoint, may occur completely before the breakpoint, or may occur completely after the breakpoint.

In one embodiment of the invention, a PLD that includes embedded memory blocks (such as any of the FLEX 10K family of devices available from Altera Corporation) works well for implementing the present invention. The embedded memory blocks are easily programmed to provide relatively large buffers (as part of the logic analyzer circuit) for the storage of captured information. Embedded memory devices are not, however, necessary for the buffering of information captured. Although devices without embedded memory may be used with the present invention, they do not lend themselves as easily to the creation of relatively large buffers. In devices without embedded memory, buffers may be implemented over multiple cells, using available memory from each cell.

In step 112, a system clock signal is specified for use by the logic analyzer. Any of a variety of signals available within the device may be specified as a system clock signal. A device clock signal that is relevant to the signals being monitored will typically be chosen as a system clock signal. A multiple of a device clock signal may also be chosen in order to sample signals more frequently.

In step 114, a breakpoint is specified. A breakpoint may include any number of signals to monitor and the logic levels that those signals must have to trigger the logic analyzer, i.e., the breakpoint describes a particular state of the device. A breakpoint may be as simple as one signal changing state, or may be a complex pattern of signals or a sequence of patterns that occur before to trigger the logic analyzer. Also, a breakpoint need not be specified in all cases; if not, the logic analyzer immediately begins capturing data upon running. Advantageously, the breakpoint can be changed at any time by the user through the use of the EDA tool, and a new breakpoint can be downloaded to the embedded logic analyzer in the device without having to recompile all of the device design files. By allowing breakpoints to be changed rapidly for a device within a system, debugging is much more efficient. Advantageously, the present invention can acquire data not only after the breakpoint, but also before it occurs.

In step 115 the user specifies the number of data samples to be captured prior to the breakpoint. Advantageously, the user may specify any number of samples to be captured prior to the breakpoint occurring, thus allowing later analysis of these prior signals to help determine the cause of a failure, error or other condition. As explained below in FIGS. 8–10, implementation of the embedded logic analyzer allows samples to be stored continuously which provides a user with any number of samples needed prior to the breakpoint. Alternatively, a user may specify the number of samples needed after the breakpoint. Because the total number of samples to be captured has been specified in step 110, it is straightforward to calculate prior samples needed based upon later samples needed, and vice-versa. The user may also specify samples needed prior to the breakpoint and samples needed after the breakpoint; total samples to be captured can then be calculated automatically.

In addition to being able to specify number of samples to be captured in step 110 and number of samples needed prior to the breakpoint in step 115, these values may also be specified after the user's design and logic analyzer have been compiled. In other words, while steps 110 and 115 specify certain values before compilation of the design, these values may also be input to the logic analyzer once the PLD has been programmed or even while the logic analyzer is running. For example, register 310 of FIG. 8 may be set at any with the value Delay [6:0] to indicate the number of samples to be captured after the breakpoint occurs. The total number of samples to be captured is equal to the number of words in sample memory 324. Other values specified before compilation can also be specified after compilation in a similar fashion, for example trigger register 304.

Once the user has specified how he or she wishes the embedded logic analyzer to function, the complete design is compiled. In step 116, the user issues a compile command to compile the user's device design along with the logic analyzer design that has been specified. In a preferred embodiment of the invention, the design files are not modified during this process. The logic analyzer design is incorporated into the output files produced. In one specific embodiment, the process shown in FIG. 4 may be used to implement step 116. Of course, other similar techniques may also be used.

The result of this step is a new output file that includes the user's design with an embedded logic analyzer. A technique by which an EDA tool may insert a custom logic analyzer in a design will be discussed in greater detail below with reference to FIG. 4. Once the new output file has be en generated, in step 118 the device is reprogrammed within its system using the new output file.

In step 120, the user connects a debugging interface cable from the device to the user's computer. The interface cable may be the same cable used to program the device or it may be a dedicate d cable for debugging. In one embodiment of the invention, the debugging cable connects to pins that have been specified by the user in step 108 as being dedicated to the logic analyzer circuit. In other words, if the user has specified the pins to which the debugging cable will be connected, the cable should be connected to those pins. In an alternative embodiment, the user need not specify the "debugging pins," rather the system specifies them automatically. In other embodiment, a dedicated JTAG port of the device may be used.

Figure 5:
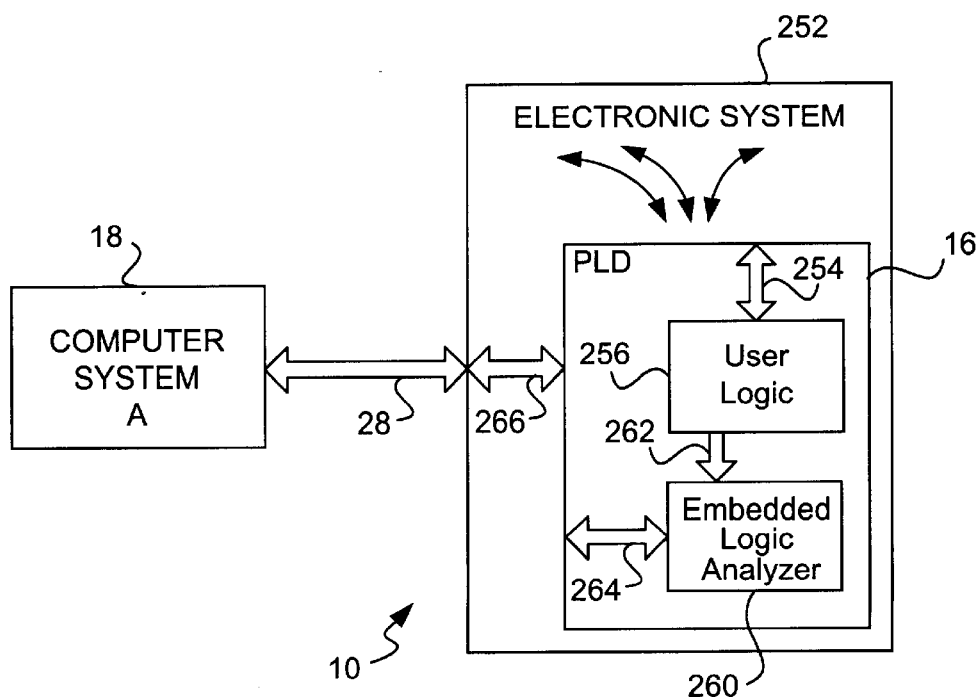
FIG. 5 is another view of the block diagram of FIG. 1, showing a programmable logic device having an embedded logic analyzer within an electronic system.

The cable may attach directly to these pins, or, the signals from these pins may be routed to an easily accessible location or port on the board to which the debugging cable may easily attach. The cable will be used to transmit instructions from the computer to the embedded logic analyzer, and also to upload captured information from the logic analyzer to the computer. As discussed below, FIG. 5 shows a PLD cont aining both a user design and an embedded logic analyzer within an electronic system. A cable 28 is shown connecting the elec tronic system to an external computer.

In step 122 the user through the EDA tool requests the embedded logic analyzer to begin running with an appropriate command. Once the logic analyzer begins to run, in step 124 it begins to continuously capture data from the signals that have been specified to be monitored. Preferably, the user then manipulates the system to duplicate previous malfunctions that the user wishes to analyze The captured data is stored within memory of the PLD, and is preferably stored within dedicated memory with in the embedded logic analyzer itself. Step 126 determines weth point has occurred. In other words, the logic analyzer determines whether the state of the signals specified to be monitored are equivalent to the e breakpoint that the user has specified. If not, then the logic analyzer continues to capture data. If so, step 128 determines whether more samples should be captured and stored after the breakpoint. Step 128 may be implemented by comparing the total number of samples desired with the number of samples that have already been stored prior to the breakpoint. If more samples are to be stored, then in step 130 the logic analyzer continues to store the desired number of samples after the breakpoint.

Once the total number of samples desired by the user have been captured and stored, the stored data is dumped from the sample memory of the logic analyzer to the user's computer in step 132. Preferably the logic analyzer uploads this stored information over the interface cable to the user's computer. In step 134 the user is able to graphically view these signals received from the logic analyzer. In one embodiment, the signals are presented in a waveform view annotated with the names of the signals. Thus, by viewing these signals of interest on a computer, a user is able to efficiently debug a hardware device in much the same way as if an external logic analyzer had been able to be connected to these signals.

Figure 4:
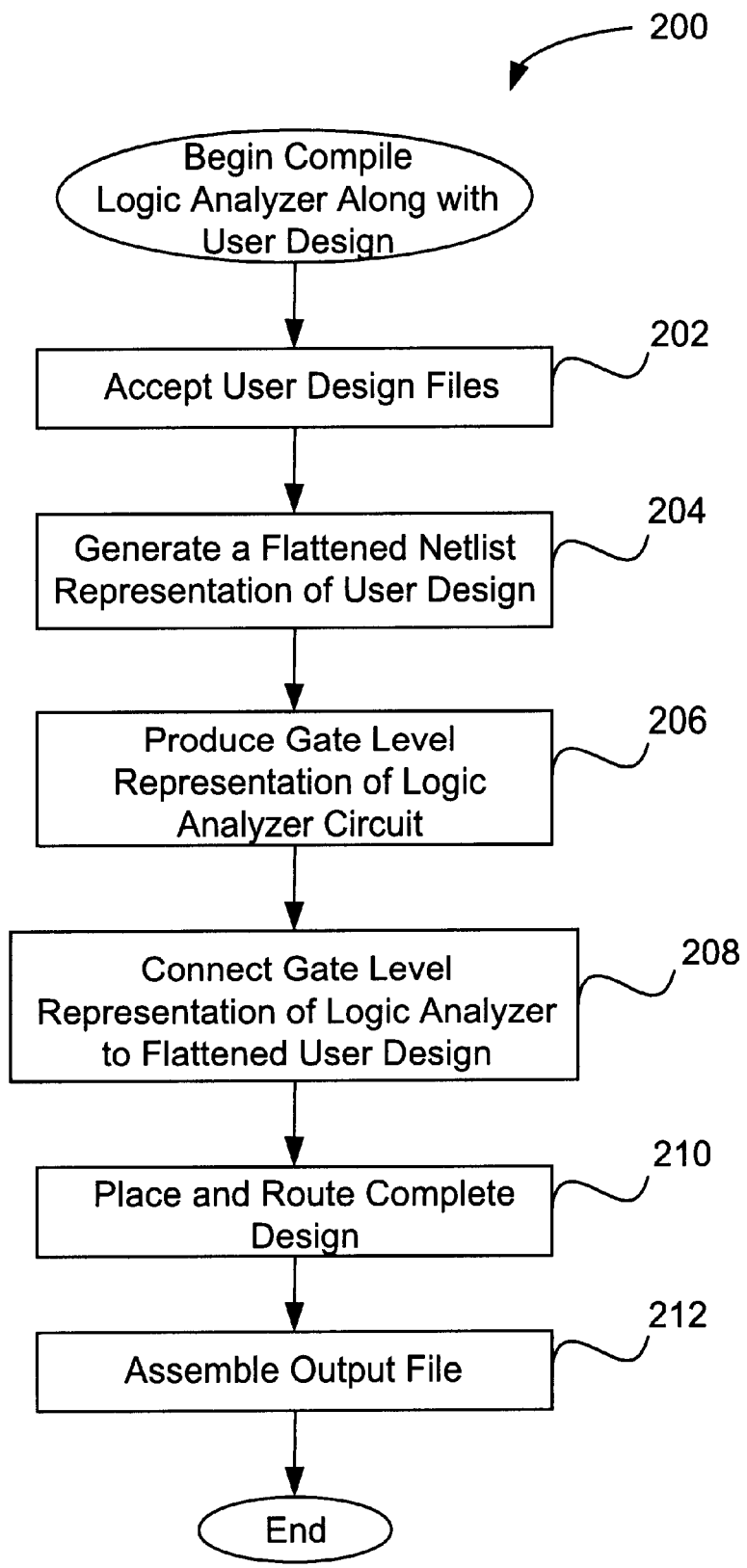
FIG. 4 is a flowchart describing a technique by which a logic analyzer may be compiled along with a user's design to embed the logic analyzer within a hardware device.

FIG. 4 is a flowchart 200 that describes a technique by which a logic analyzer circuit may be automatically inserted into, and automatically compiled along with, a user design. The technique of FIG. 4 is a suitable technique by which step 116 of FIG. 3B may be implemented (in the context of PLD compilation). It should be appreciated that a variety of compilation techniques may be used with the various EDA tools, for PLD design as well for other types of integrated circuits. The embodiment of FIG. 4 illustrates how the present invention may be used with one such compilation technique, although it is contemplated that the present invention is applicable to any of a wide variety of compilation techniques.

In step 202 an EDA tool accepts the user design files necessary to describe an electronic design for a device such as a PLD. These design files may often specify the design elements for the design. In many design environments, the design elements are arranged in a hierarchy, from root entity to leaf entities. In such cases, if the design uses a particular register in numerous locations throughout the design, there may be only one file containing the implementation of this design, yet the complete design may reference that one file in numerous locations. Examples of such electronic design files are discussed above with reference to FIGS. 1 and 2.

Step 204 takes these user design files and generates a flattened netlist representation of the user design. In other words, should the design files include a hierarchy, this hierarchy is "flattened out" so that each entity referenced in the design is duplicated as many times as it is used. Using the above example, if a particular register is used twice in the design hierarchy, yet only one file exists to describe this register, this step flattens out the design by producing two such files for the register. The representation of the user design in this step is preferably a synthesized technology-mapped database that will be appreciated by those of skill in the art. At this point in the compile process, a synthesized netlist of the user design has been created in a flattened state. Typically, generation of such a netlist is referred to as a "synthesis" step in the compilation process, after elaboration has occurred.

In step 206, a gate level representation of the logic analyzer circuit is produced. The logic analyzer circuit may take a wide variety of forms. By way of example, logic analyzer circuit 260 of FIG. 8 may be used, although it should be appreciated that a logic analyzer circuit may be implemented in many ways while still performing the functionality of the circuit shown in FIG. 8. In a preferred embodiment of the invention, a logic analyzer circuit is included in the EDA tool so that a gate level representation may be produced automatically. Alternatively, a user could be allowed to specify a custom circuit. This gate level representation takes into account each logic element of the circuit, along with the number and names of the signals to monitor specified by the user in step 108, the number of samples to be captured specified in step 110, number of samples needed prior to breakpoint specified in step 115, and the breakpoint as specified in step 114. Those of skill in the art will appreciate the process by which a gate level representation of a particular circuit is produced.

The actual gate level representation of a particular logic analyzer circuit will depend upon the particular device in which the logic analyzer will be embedded. By way of example, the hardware device in which to embed the logic analyzer may include any of the PLD devices available from Altera Corporation. In particular, any of the FLEX 10K, FLEX 8000, MAX 9000, or MAX 7000 devices work well. Each of these particular devices may have different features that would affect how a gate level representation for a logic analyzer is produced. For example, for a FLEX 10K device with relatively large embedded memory sections, the is embedded memory is particularly well suited for implementing a large FIFO (first in first out) memory for the logic analyzer. For a device such as the FLEX 8000 without embedded memory, the memory elements (such as SRAM flip-flops) of logic cells may be used for the memory of the logic analyzer but the FIFO buffer may have to be divided over multiple cells if the memory in a single cell is not sufficiently large to accommodate the e buffer. Similarly, a device based upon EEPROM technology may also use one or more of its logic cells for the logic analyzer's buffer. A device having large embedded memory works particularly well with the present invention because of the larger capacity for signal storage. Thus, step 206 produces a representation for a logic analyzer circuit that is to be connected to the user's design.

In step 208 the gate level representation of the logic analyzer circuit from step 206 is connected to the flattened representation of the user design of step 204. This step makes the logic connections from the inputs of the logic analyzer (breakpoint signals, system clock, signals to monitor) to lines providing the actual signals specified in the user's design. As those signals have previously been specified in steps 108 through 115, the EDA tool is able to find the particular signal lines within its database representation of the electronic design and to make the appropriate connection to an input of the logic analyzer.

Figure 6:
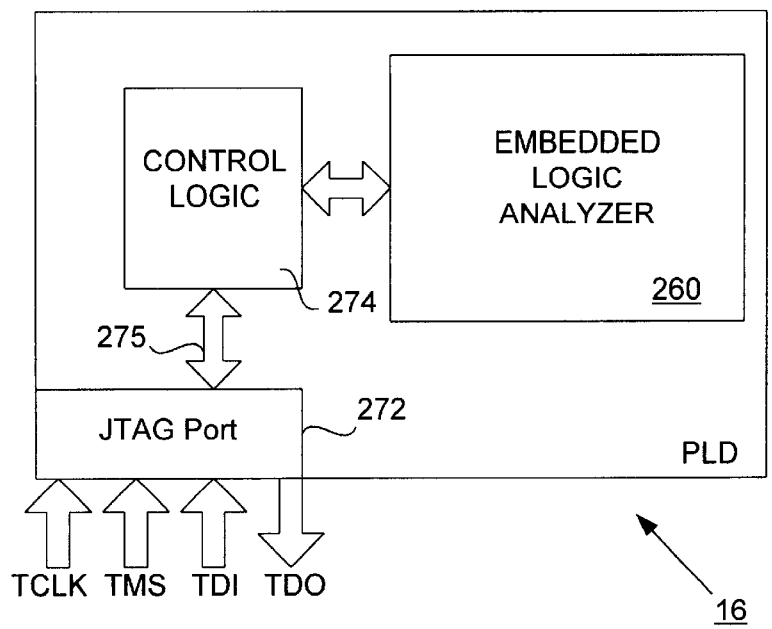
FIG. 6 is a more detailed block diagram of a programmable logic device having an embedded logic analyzer.

In addition, this step makes appropriate connections from the logic analyzer to an interface to the user's computer. In the embodiment of FIG. 6, discussed below, this interface includes test data registers 274 linked to JTAG port 272.

Figure 7:
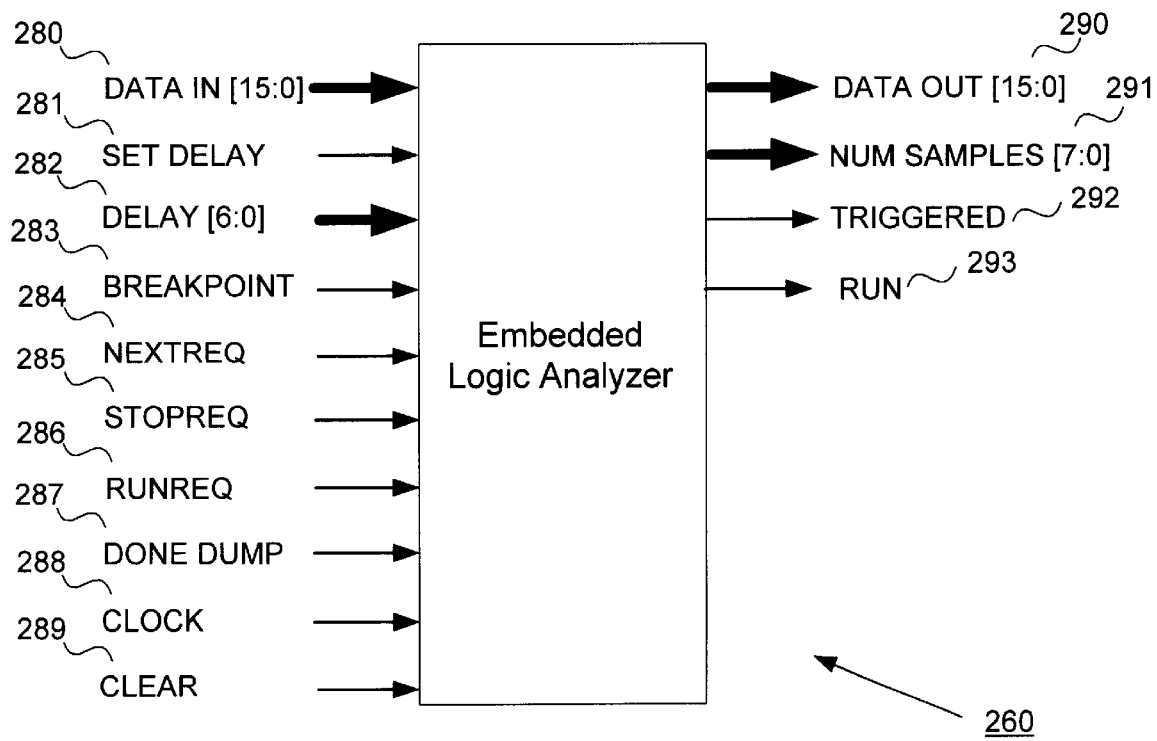
FIG. 7 illustrates an embedded logic analyzer showing its inputs and outputs according to one embodiment of the present invention.

Accordingly, input and output connections to and from the logic analyzer that provide an interface to the user computer are connected to the appropriate test register. For example, as shown in FIGS. 7 and 8, input signals (from the user computer to the logic analyzer) Trigger Signals, Trigger Register, Set Delay, Delay[6:0], NextReq, StopReq, RunReq, and Clear are connected to appropriate test registers. Output signals (from the logic analyzer to the user computer) DataOut[15:0], NumSamples[7:0], Triggered and Run are also connected to the appropriate test register. Test registers are preferably constructed from programmable logic, and will be familiar to those of skill in the art.

Of course, another embodiment of a logic analyzer circuit may use different signals and/or a greater or fewer number of interface signals. In a preferred embodiment of the invention, these interface signals to and from the logic analyzer are connected to dedicated pins on the PLD reserved for this purpose. Thus, a user will know to which pins the debugging cable should be attached. As noted, these pins not only control the embedded logic analyzer, but also receive data from it. In other embodiments, these dedicated pins may be routed to another part of the circuit board for easy attachment of a cable. In this fashion, the logic for the logic analyzer circuit created in step 206 is connected to both the user design and to interface pins of the PLD for communication with the user computer.

In step 210 the complete design created in step 208 is placed and rout ed in a fashion that will be appreciated by those of skill in the art. The output of the place and rout e step is then input to step 212 in which the output file is assembled. This output file may then be downloaded to a PLD in order to program it. Once a PLD has been programmed with this file, a user may begin use of the embedded logic analyzer in order to debug the device.

FIG. 5 is another view of programmable logic development system 10 of FIG. 1, showing a programmable logic device having an embedded logic analyzer within an electronic system. System 10 shows an electronic system 252 connected to computer system A 18 via cable 28 or other connective appliance. Electronic system 252 includes PLD 16, a component of the electronic system. PLD 16 potentially shares one or more electronic connect ions 254 with the other components and elements the at make up the electronic system. PLD 16 has been configured with a user logic design 256 and an embedded logic analyzer 260. User logic 256 is configured with a design according to the methodology described in FIG. 2, or any other suitable design methodology. Embedded logic analyzer 260 has been incorporated into PLD 16 according to one embodiment of the invention described in FIGS. 3A and 3B.

Logical connections 262 allow signals from user logic 256 to be transmitted to logic analyzer 260. These signals may include a system clock, trigger signals, signals to monitor, etc. Pins of PLD 16 are used to connect interface signals 264 from the logic analyzer to corresponding connections 266 in electronic system 252. Cable 28 is used to connect these interface signals to computer 18. Alternatively, computer 18 may be directly connected to PLD 16 to transmit interface signals 264 to the PLD. In this manner, computer 18 transmits commands and other information to embedded logic analyzer 260, and receives information from the logic analyzer without directly interrupting or affecting the functional operation of electronic system 252. PLD 16 is thus configured to perform both the functions of user logic 256 and embedded logic analyzer 260.

Those of skill in the art will appreciate that the actual interface used between logic analyzer 260 and an external computer system may take a variety of forms. The embedded logic analyzer as herein described may be controlled by an outside computer using any suitable interface on the PLD. Furthermore, the exact number of pins on PLD 16 used to control logic analyzer 260 and to receive data from it may vary depending upon the device being programmed, the overall board design, etc. It will further be appreciated that pins used may be flexibly assigned, or that dedicated interface pins may be used. For example, interface signals 264 that provide an interface between logic analyzer 260 and external pins of PLD 16 may be implemented as described in the above-referenced U.S. patent application Ser. No. 08/958,435. Other techniques for controlling an embedded logic analyzer and for receiving output data may also be used.

FIG. 6 illustrates another view of PLD 16 showing a preferred embodiment for controlling a logic analyzer using the JTAG port of the device in which the logic analyzer is embedded. Not shown for clarity within PLD 16 is user logic 256. In this preferred embodiment, interface signals 264 are implemented using a JTAG port 272 in conjunction with control logic 274 and signals 275. A JTAG (Joint Test Action Group) port 272 is implemented under the IEEE 1149.1 standard and is known to those of skill in the art. Control logic 274 provide buffering between logic analyzer 260 and JTAG port 272 for particular signals that are described below in FIG. 7. More specifically, control logic 274 supplies control signals to logic analyzer 260 and assists with retrieving data and status from the logic analyzer.

In this embodiment, JTAG port 272 includes signals TCLK, TMS, TDI and TDO. Signal TCLK is a clock signal that controls the rate of serial data in and out of JTAG port 272. Signal TMS is a mode select signal that selects any of the sixteen states of the JTAG port. Signals TDI and TDO are serial data in and serial data out, respectfully.

Typically, a JTAG port is used either to program a PLD or to assist with testing a circuit board on which PLDs are located. Advantageously, it is realized that a JTAG port has traditionally been unused during the design and debugging of a particular PLD. Thus, it is further realized that a JTAG port on a PLD is under utilized and may be used during debugging of a PLD as a means of communicating with and controlling an embedded logic analyzer of the present invention. Advantageously, a standard JTAG port is used to facilitate debugging of a programmable logic device that includes an embedded logic analyzer. Two particular embodiments for implementing control logic 274 to facilitate control of an embedded logic analyzer by a JTAG port are described below in FIGS. 11–13 and 14–17, respectively.

FIG. 7 illustrates the input and output signals for embedded logic analyzer 260 according to one embodiment of the present invention. Signals DataIn 280 are the signals specified by the user in step 108 that are to be monitored for the purpose of debugging the PLD. Signal SetDelay 281 is a control line that causes register 310 to be loaded by the value of signal Delay 282 which indicates the number of samples to be captured following a breakpoint. Signal Delay 282 indicates the number of samples to be captured following a breakpoint and is received from computer system 18 after being specified by the user. Signal Breakpoint 283 indicates to the logic analyzer when a breakpoint has occurred. This signal is generated from trigger comparator 306 within the logic analyzer, or may be generated within the user designed logic.

Signal NextReq 284 is received from computer system 18 and allows retrieval of stored sample data a sample at a time, and indicates that the next sample should be uploaded to computer system 18. Signal StopReq 285 is received from computer system 18 and directs the logic analyzer to enter its stop state and to stop capturing signal samples. Signal RunReq 286 is received from computer system 18 and directs the logic analyzer to begin running and capturing sample data. Signal DoneDump 287 directs the logic analyzer to discontinue dumping data from its memory to the computer system and to enter a stop state. This signal may be received from within the logic analyzer or from the user. Signal Clock 288 is the system clock signal specified in step 112. Signal Clear 289 is a reset signal that clears control state machine 302, sample memory 324 and counter 314.

Signals DataOut 290 are the output signals from sample memory 324 that transfer captured signals a word at a time from logic analyzer 260 to computer system 18 via interface 264. Signal NumSamples 291 indicates the number of valid samples captured by logic analyzer 260. Because the actual number of valid samples captured by the logic analyzer may be less than the total number of samples requested by the user, this signal assists the user in determining which are the valid samples stored in memory. For example, the user may desire to capture a total of 128 samples but does not wish to store any samples after a breakpoint occurs. If a breakpoint occurs after only sixty-four samples have been captured, the signal NumSamples 291 will have a value of sixty-four, thus indicating that only sixty-four samples stored in the logic analyzer are valid samples. Any samples stored beyond the sixty-four will not be valid samples; they may have been present from an earlier data capture. Signal Triggered 292 is an output signal for the user that indicates that a breakpoint has occurred. Signal Run 293 indicates to the user that signal RunReq 286 has been received and that the logic analyzer is running and capturing data.

FIG. 8 illustrates embedded logic analyzer 260 according to one embodiment of the present invention. A logic analyzer to be embedded within a PLD may be implemented in a wide variety of manners depending upon the type of PLD, signal type and number to be monitored, depth of data desired, memory available, control signals from the user's computer and preferences of the designing engineer, etc. By way of example, logic analyzer 260 is one particular example of how such a logic analyzer may be implemented. The embedded logic analyzer is controlled by the user from a computer external to the PLD and operates to capture any of a variety of internal signals that the user wishes. In this embodiment of the invention, logic analyzer 260 includes control state machine 302, trigger register 304, trigger comparator 306, registers 308 and 310, counters 312–316, comparators 320, 322 and sample memory 324.

Once logic analyzer 260 has been programmed into a PLD, it receives a variety of inputs from signals within the PLD. Trigger signals 305 are those signals specified in step 114 that the user wishes to compare to a trigger condition stored in trigger register 304 that was also specified in step 114. Together, trigger signals 305 that satisfy the trigger condition result in a breakpoint. Trigger comparator 306 compares signals 305 to the trigger condition and generates a breakpoint signal when appropriate.

Figures 9, 10:
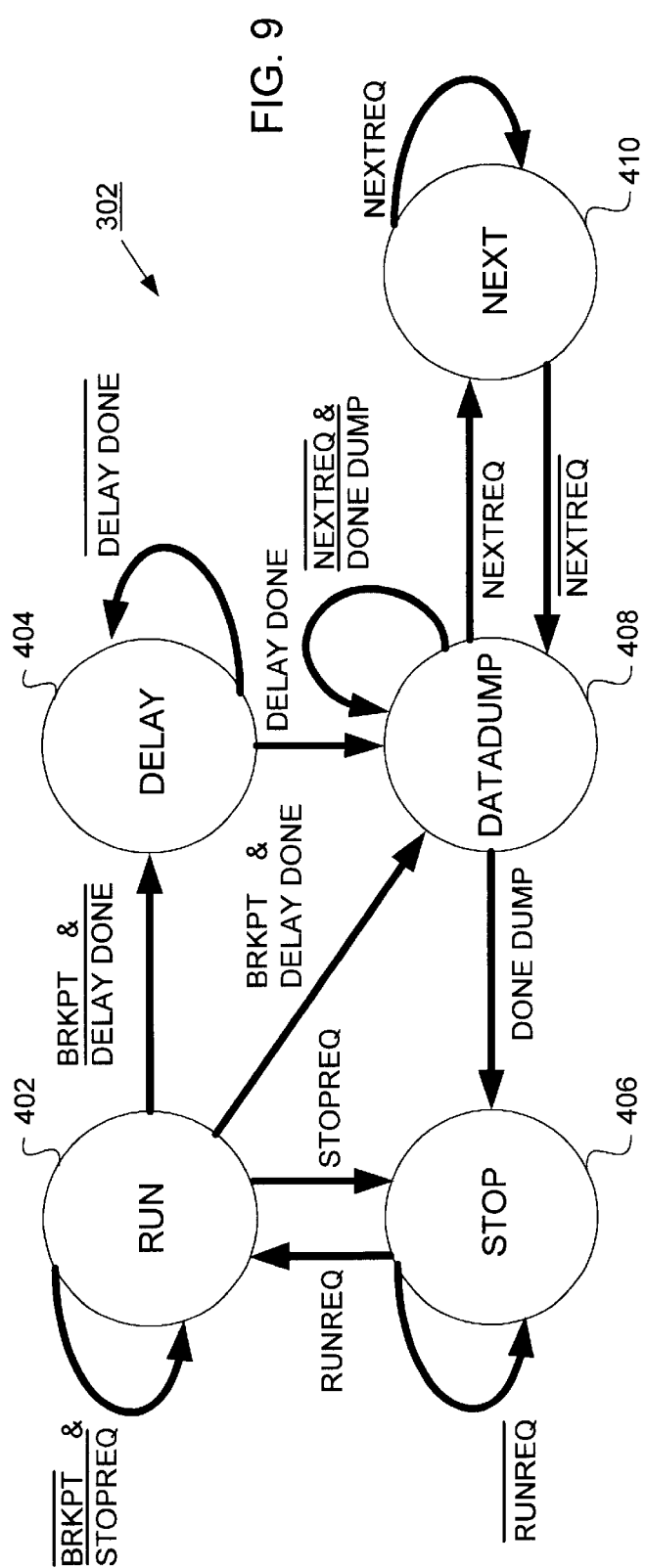
FIG. 9 is a symbolic view of the operation of the control state machine of the embedded logic analyzer.
FIG. 10 is a table indicating the states and corresponding state outputs of the control state machine according to one embodiment.

Control state machine 302 may be any suitable control structure for controlling the embedded logic analyzer and is described in greater detail in FIG. 9. Preferably, state machine 302 is implemented in programmable logic using any of a variety of look-up tables, embedded memory blocks, ROM registers, etc. Input signal DelayDone is received from comparator 320 and indicates that the total number of samples requested by the user have been captured. Signals NextReq, StopReq, RunReq, DoneDump, Clock and Clear have been described above. Input signal Breakpoint to state machine 302 is received from trigger comparator 306 via register 308.

Register 308 is a synchronizing register used to shield state machine 302 from an asynchronous breakpoint signal. Register 308 allows the input signal breakpoint to be input on a clock cycle.

Output signal Stopped is active when state machine 302 is in its stop state. This signal resets counters 312 and 316 and prepares the logic analyzer to begin running anew. It also permits data from register 310 to be loaded into counter 314. Output signal Next when active enables counter 312 to increment an address in sample memory 324. Addresses are incremented while the logic analyzer is running and capturing data and while sample memory 324 is stepping though its addresses and dumping sample data to computer system 18. Output signal Triggered is used to enable counter 314. Signal Run is combined in gate 340 with signal PrevDataFull to enable counter 316.

Register 310 accepts signal Delay in order to store the number of samples following a breakpoint that a user wishes to capture. Its clock is the input signal SetDelay.

Counter 312 increments addresses for sample memory 324 during sampling and capturing data, and increments addresses during reading data out to computer system 18. Counter 314 is a down counter that creates a delay from an observed breakpoint in order to allow the logic analyzer to continue capturing data until the last sample desired by the user has been stored. Counter 314 is loaded from register 310 with signal Delay which indicates the number of samples past the breakpoint that should be stored. Once counter 314 counts down and reaches a value of zero, comparator 320 performs a successful comparison with a hardwired zero value and asserts signal DelayDone. Signal DelayDone when asserted instructs control state machine 302 to move from a run state to a data dump state.

Counter 316 counts the number of valid samples that have been stored in sample memory 324. As discussed above, a situation may occur in which the number of valid samples captured is less than the originally specified total number of samples desired by the user. In this illustrative example, sample memory 324 has a capacity of 128 words. Thus, when counter 316 reaches the value 128, comparator 322 performs a successful comparison with a hardwired value 128. Accordingly, output signal PrevDataFull is asserted and its inverse is input to gate 340. The inverse of an asserted signal PrevDataFull disables counter 316, thus indicating the total number of valid samples stored in sample memory 324. Counter 316 also continuously outputs signal NumSamples that indicates the total number of valid samples that have been captured to that point in time.

Sample memory 324 is memory within PLD 16 that may be implemented in any suitable fashion. By way of example, memory 324 may be implemented using sets of registers or using embedded memory blocks within the PLD. In one specific embodiment of the invention, embedded SRAM memory is used to implement memory 324. Of course, memory 324 may be implemented in many types of PLDs that do not contain extra embedded memory. Preferably, sample memory 324 is implemented as a ring buffer such that incoming sample data is continuously stored in memory 324 when the logic analyzer is running. As memory 324 fills, it wraps around to its beginning and the oldest data stored is overwritten by new incoming data. For illustrative purposes, sample memory 324 is shown implemented using RAM memory of 128 words of 16 bits each. Of course, any of a variety of sizes of memory may be used. The width of the memory may be increased to capture more data signals and its depth may be increased to store a greater history of signals.

FIG. 9 is a state diagram for control state machine 302. FIG. 10 is a table illustrating the value of output signals associated with each of the five states of state machine 302. It will be appreciated by those of skill in the art that control state machine 302 may be implemented using any suitable logic and need not necessarily be implemented as a state machine. If implemented as a state machine, a variety of state machines such as a Moore or a Mealy state machine may be used. In a preferred embodiment of the invention, state machine 302 is implemented as a Moore state machine as will now be described with reference to both FIGS. 9 and 10.

State machine 302 includes the states Run 402, Delay 404, Stop 406, DataDump 408 and Next 410. When in the Stop state the output signal Stopped is asserted and the other output signals Run, Triggered and Next are in a "don't care" condition. The Stop state is maintained until input signal RunReq becomes asserted which causes a transition to the Run state.

When in the Run state, output signals Run and Next are asserted and the output signal Triggered is a zero because a breakpoint has not yet occurred. While both input signals Breakpoint and StopReq remain unasserted, the Run state is maintained. If a StopReq signal is received, the state machine enters the Stop state. If a Breakpoint signal is received and signal DelayDone remains unasserted (indicating that more samples are to be captured) the system enters the Delay state. On the other hand, should a Breakpoint signal be received and signal DelayDone is asserted, this indicates that not only has a Breakpoint occurred but that no signals occurring after the Breakpoint need be captured. In this situation, the state machine enters the DataDump state.

While in the Delay state signals Run, Triggered, and Next are asserted, while output signal Stopped is unasserted. The Delay state indicates that the logic analyzer is still running and capturing data after a triggering condition has set the breakpoint. The state machine remains in this state until all of the required samples after the breakpoint have been captured. Accordingly, while signal DelayDone is unasserted the Delay state is maintained. As soon as counter 314 counts down and indicates that all required samples after the breakpoint have been captured, signal DelayDone has become asserted and the state machine enters the DataDump state.

While in the DataDump state, all output signals are unasserted. In this state, data is dumped from sample memory 324 to computer system 18. When the signal DoneDump is asserted, the logic analyzer has finished uploading data to computer system 18 and the state machine moves from the DataDump state to the Stop state. The state machine remains in the DataDump state while signals NextReq and DoneDump are both unasserted. As described earlier, it is possible for computer system 18 to request an upload of a word at a time from sample memory 324. In this situation, computer system 18 asserts input signal NextReq causing the state machine to enter the Next state.

While in the Next state, all output signals except for output signal Next are unasserted. As long as the logic analyzer continues to receive an asserted signal NextReq it uploads a word at a time to computer system 18. As soon as signal NextReq becomes unasserted, the state machine returns to state DataDump.

JTAG Port Control Overview

As described above with reference to FIG. 6, a preferred embodiment of the invention uses JTAG port 272 along with control logic 274 and signals 275 for controlling logic analyzer 260. It is realized that use of a JTAG port for control of a logic analyzer would be advantageous in that a JTAG port is often already present on a PLD. Furthermore, use of a JTAG port would obviate the need to add extra, dedicated debugging control pins. Furthermore, many manufacturers of PLDs already have facilities for connecting and communicating through a JTAG port of a PLD. For example, Altera Corporation of San Jose, Calif. uses an internal product known as "Byte Blaster" to program a PLD through a JTAG port. For these reasons and others, it is realized that use of a JTAG port to control an embedded logic analyzer would be advantageous. Nevertheless, how to implement such control using a JTAG port is not intuitively obvious for a variety of reasons.

For background, more detail on use of a JTAG port will now be provided. A JTAG testing device tests a hardware device having a JTAG port by basically taking over control of the pad ring of the device. In other words, the JTAG tester takes over control of the drivers for each pin, effectively isolating the core of the device from the outside world. Using the JTAG port of the device then, the JTAG tester is able to put each pin into one of three states: drive, sense, or tri-state. The JTAG testing device is primarily used in an EXTEST mode to perform a full board test of the physical connections between devices on a board. By driving a pin on one device to output a signal, and sensing an input on another device on the board, the JTAG tester in this mode is able to test the physical connection between the devices while on the board. As such, EXTEST mode would be unsuitable for controlling an embedded logic analyzer. The INTEST mode is used less often and is used to internally test a device. As above, the JTAG testing device takes control of each pin driver and isolates the core. Test signals may then be driven into the core and output signals may be sampled and their accuracy determined.

Unfortunately, because the INTEST mode disconnects the core of the device from the outside world, the PLD is not being tested in a real-world environment on the circuit board. As previously explained, it is often necessary to test a PLD within the real-world environment of an operating circuit board in order to track down elusive malfunctions. Furthermore, a JTAG port is only a 10 MHz serial port, and is thus not able to provide the high-speed volume of data that might occur in a real-world environment. Thus, actual high speed operating conditions would be desirable. Additionally, during a JTAG test, the engineer provides contrived test vectors that may not be representative of real-world signals that the PLD would receive in a true operating environment. For these reasons and others, it may not be particularly desirable to attempt to control an embedded logic analyzer of a PLD using the INTEST mode of the JTAG port. Nevertheless, it is realized that using a JTAG port in some fashion to control an embedded logic device would be desirable. Advantageously, the present invention contemplates two embodiments by which JTAG port 272 controls embedded logic analyzer 260 of a PLD 16. Advantageously, a JTAG port is used to control the embedded logic analyzer while the PLD in which the logic analyzer is embedded is allowed to operate on the circuit board in a real-world environment. These two embodiments are presented below in FIGS. 11–13 and FIGS. 14–17, respectively.

First JTAG Control Embodiment

Figure 11:
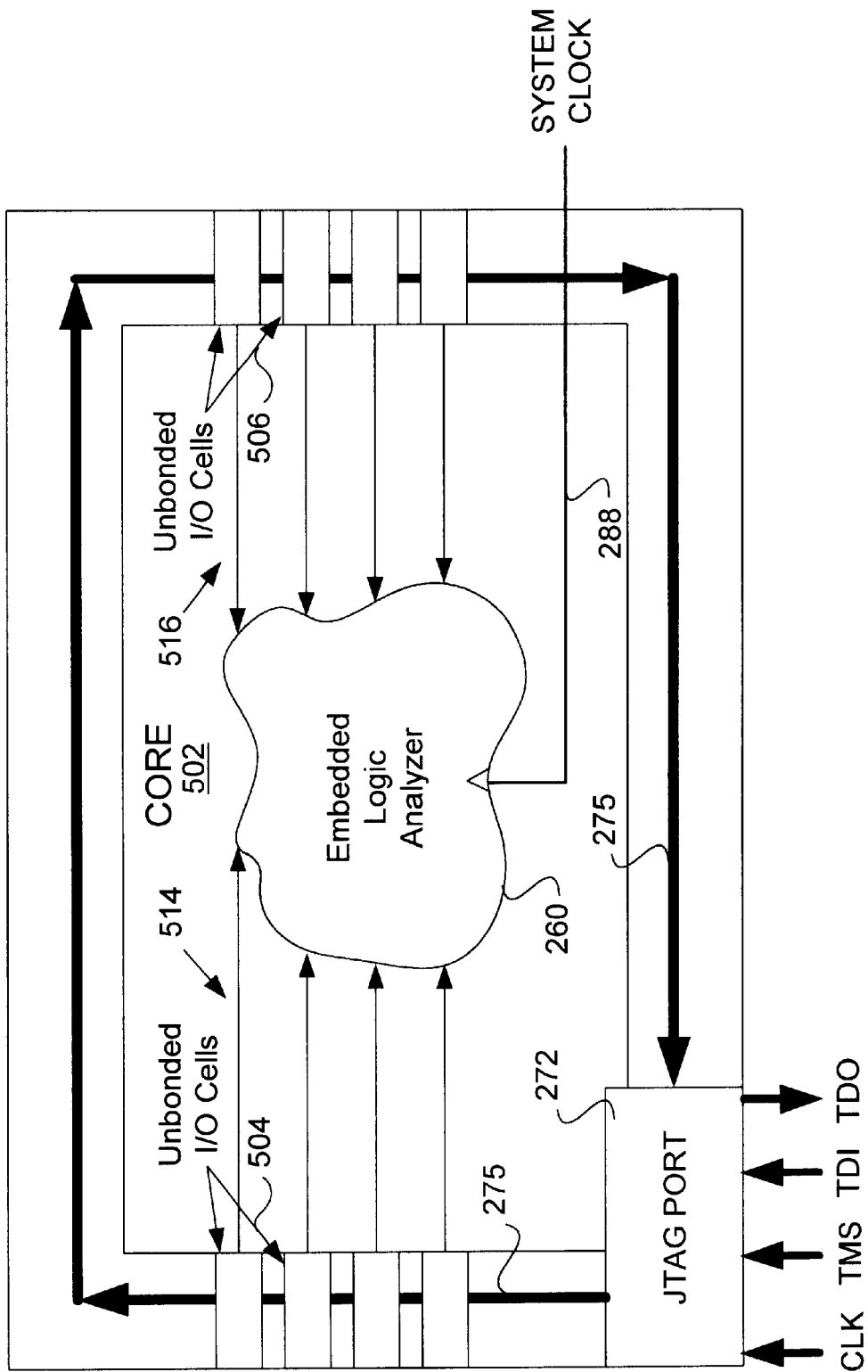
FIG. 11 illustrates a first embodiment by which a JTAG port controls an embedded logic analyzer using unbonded I/O cells.

FIG. 11 illustrates a first embodiment by which JTAG port 272 controls embedded logic analyzer 260 of PLD 16 using groups of unbonded I/O cells 504 and 506. Logic analyzer 260 is embedded in core 502 of PLD 16 and has a system clock 288. Cells 504 deliver signals 514 to the logic analyzer, and cells 506 receive signals 516 from the logic analyzer. Signals 275 represent signals from JTAG port 272 to and from I/O cells 504 and 506. Included are: signal TDI that connects to serial data in (SDI) of the first input cell 504; TDO that connects to serial data out (SDO) of the last output cell 506; and control signals such as Shift 680, Clock 682, Update 684, and Mode 686 that are provided to each cell as required. In this embodiment, JTAG-enabled I/O cells 504 are used to control logic analyzer 260 via input signals 514. Output data and status information signals 516 from logic analyzer 260 is connected to JTAG-enabled I/O cells 506.

To implement this embodiment, the netlist of the PLD is augmented to route each input to and each output from logic analyzer 260 to an unbonded or otherwise unused I/O cell 504 or 506, respectively. A special "debug RAM bit" is set for each I/O cell that is used to supply a control signal to the logic analyzer; this bit allows a control signal to be driven using the JTAG port even though the device is not placed into INTEST mode. To generate a control signal for delivery to logic analyzer 260, the known JTAG Sample/Preload instruction is scanned in, the control information is scanned in, and then the Update/Data Recovery state of JTAG port 272 is entered. Further details are provided below. To better illustrate the advantages of this embodiment, the known JTAG INTEST mode will be briefly described.

Figure 12:
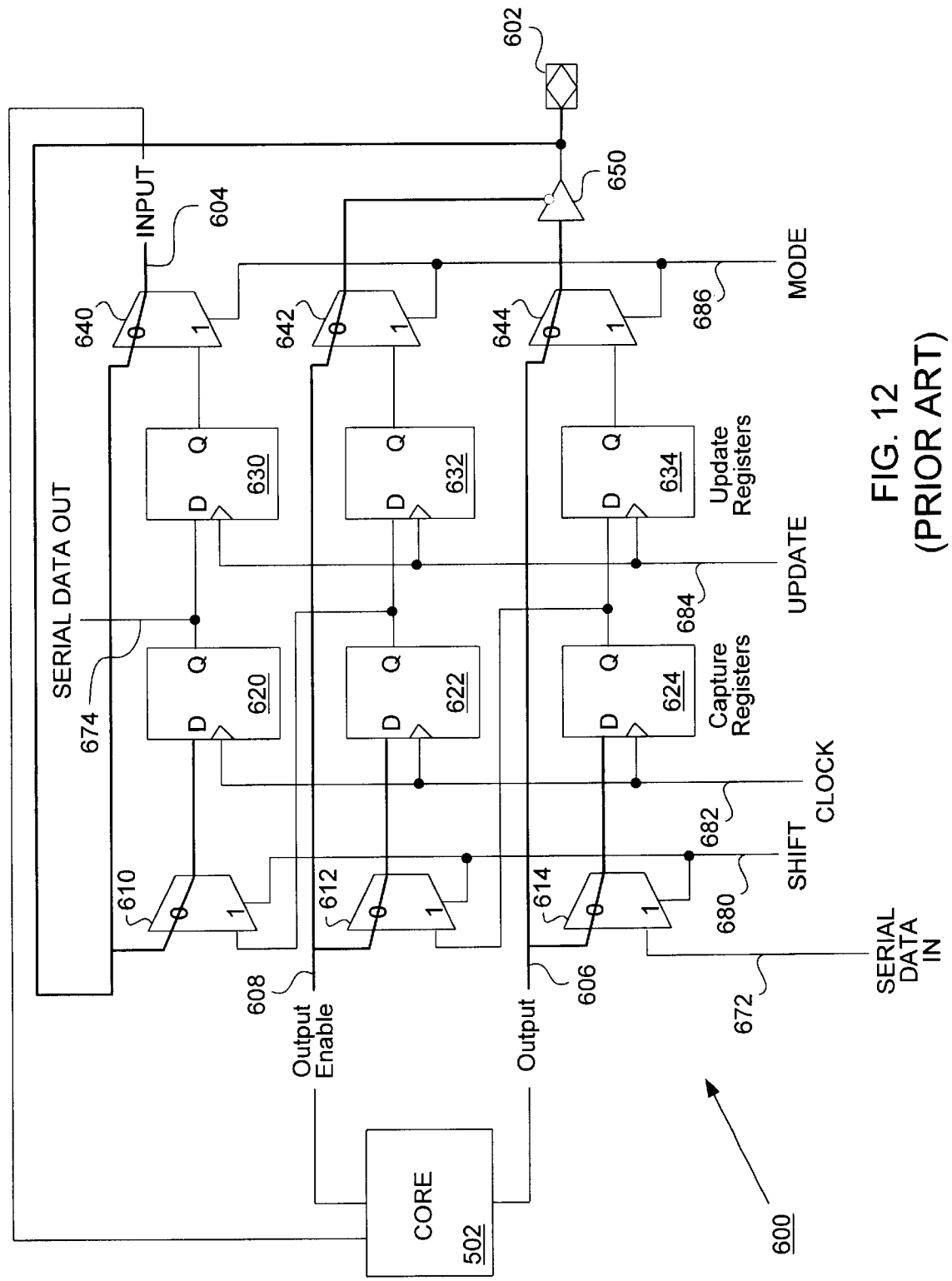
FIG. 12 illustrates a prior art JTAG-enabled I/O cell.

FIG. 12 illustrates a prior art JTAG-enabled I/O cell 600 that provides a useful background for discussion of this embodiment. Cell 600 connects to an external PLD pin 602. Through pin 602, input signal 604 is provided to core 502 of PLD 16. Similarly, signals output 606 and output enable 608 originate within core 502 and are used to produce an output signal at pin 602. Multiplexers 610, 612 and 614 select data to be loaded into capture registers 620, 622 and 624, respectively. The capture registers are used to scan in data initially from JTAG port 272 through the I/O cells of the device. Update registers 630, 632 and 634 receive data from the capture registers and are used to perform a parallel load to the core of the device. Multiplexers 640, 642 and 644 select data from either pin 602 input, output enable 608, and output 606, respectively, or from one of the update registers to produce an appropriate signal. Multiplexer 640 produces input signal 604, multiplexer 642 produces a tri-state signal for driver 650, and multiplexer 644 provides a data signal for driver 650 which produces an output at pin 602 when enabled.

Operation of JTAG-enabled cell 600 will be appreciated by those of skill in the art. Serial data in 672 is a signal received from the previous I/O cell (or from the TDI signal of JTAG port 272 if this is the first cell), and serial data out 674 is connected to the serial data in signal of the next I/O cell (or to signal TDO of JTAG port 272 if this is the last I/O cell). Control signals Shift 680, Clock 682, Update 684 and Mode 686 are received for each cell from JTAG port 272 via control lines 275. Shift 680 operates to shift the serial data in signal 672 through cell 600. Clock 682 clocks the capture registers to capture the serial data, and update 684 clocks the update registers to enable a parallel load. Mode 686 allows cell 600 to either be in a normal mode (mode=0) or to be in the INTEST or EXTEST mode (mode=1). In typical JTAG operation, when mode 686 places the device in INTEST or EXTEST mode, signals output 606, output enable 608 and input 604 are effectively cut-off from pin 602, and thus, core 502 of the device is isolated from the outside world. As discussed earlier, it would be undesirable to place the device completely into INTEST mode if it is desired to test the device in a real-world environment. For example, if mode 686 places the device into INTEST mode, all pins of the device would be isolated from its core and normal operation of the device would be prevented.

In standard JTAG INTEST mode, JTAG port 272 first enters a serial shift mode in which serial data received over line TDI is shifted through all I/O cells of the device until the appropriate data is present at the appropriate input cell. Then JTAG port 272 enters a parallel load mode in which all of the data recently shifted into the I/O cells is then loaded in parallel into core 502 to supply input signals as required by a particular test. Concurrently or subsequently, JTAG port 272 may be in a parallel sense mode for various I/O cells that receive the output from the test. Once this test data has been received, JTAG port 272 again enters the serial shift mode and data is shifted serially out of the I/O cells to be output from JTAG port 272 over line TDO. In this fashion, the INTEST mode of JTAG port 272 uses JTAG-enabled I/O cells to provide contrived test data to core 502 and to receive outputs from that test.

As described above, however, using the true INTEST mode can be disadvantageous in that the INTEST mode disconnects all pins of PLD 16 form core 502. Thus, PLD 16 is not operating in a real-world environment and use of logic analyzer 260 in this mode might not provide true test results. Advantageously, the present invention makes use of unbonded I/O cells 504, and tricks certain of these cells into thinking that they are in INTEST mode to allow control of logic analyzer 260 by JTAG port 272.

It is realized that many PLDs may have extra I/O cells 504 and 506 that are unbonded to a pin of the PLD yet are still electrically connected to core 502. Advantageously, the present invention realizes that these unbonded I/O cells 504 and 506 can be used not only to supply control and data information to logic analyzer 260, but also that they may be used to receive status and output information from the logic analyzer as well. Furthermore, this embodiment does not use the true INTEST mode; thus PLD 16 may be operated in a real-world environment and logic analyzer 260 may capture real test data. In order to still provide control and input information via unbonded I/O cells 504 over lines 514, these cells are tricked into thinking that they are actually in INTEST mode so that they will drive logic analyzer control signals inward from the cell to core 502. These inwardly driven signals may then be used to provide control and input data for logic analyzer 260. Advantageously, no extra logic is required to implement this method of control.

Using this technique, only I/O cells 504 that are tricked into thinking they are in INTEST mode will be driven inward. In this fashion, control and data signals are provided to logic analyzer 260 using unbonded I/O cells 504 that are not connected to any pins of PLD 16. Because cells corresponding to unused pins of PLD 16 are being used for control and data input/output of logic analyzer 260, the remaining pins of PLD 16 communicate with core 502 and with the outside world in a true operating environment and are unaffected by this control method.

Figure 13:
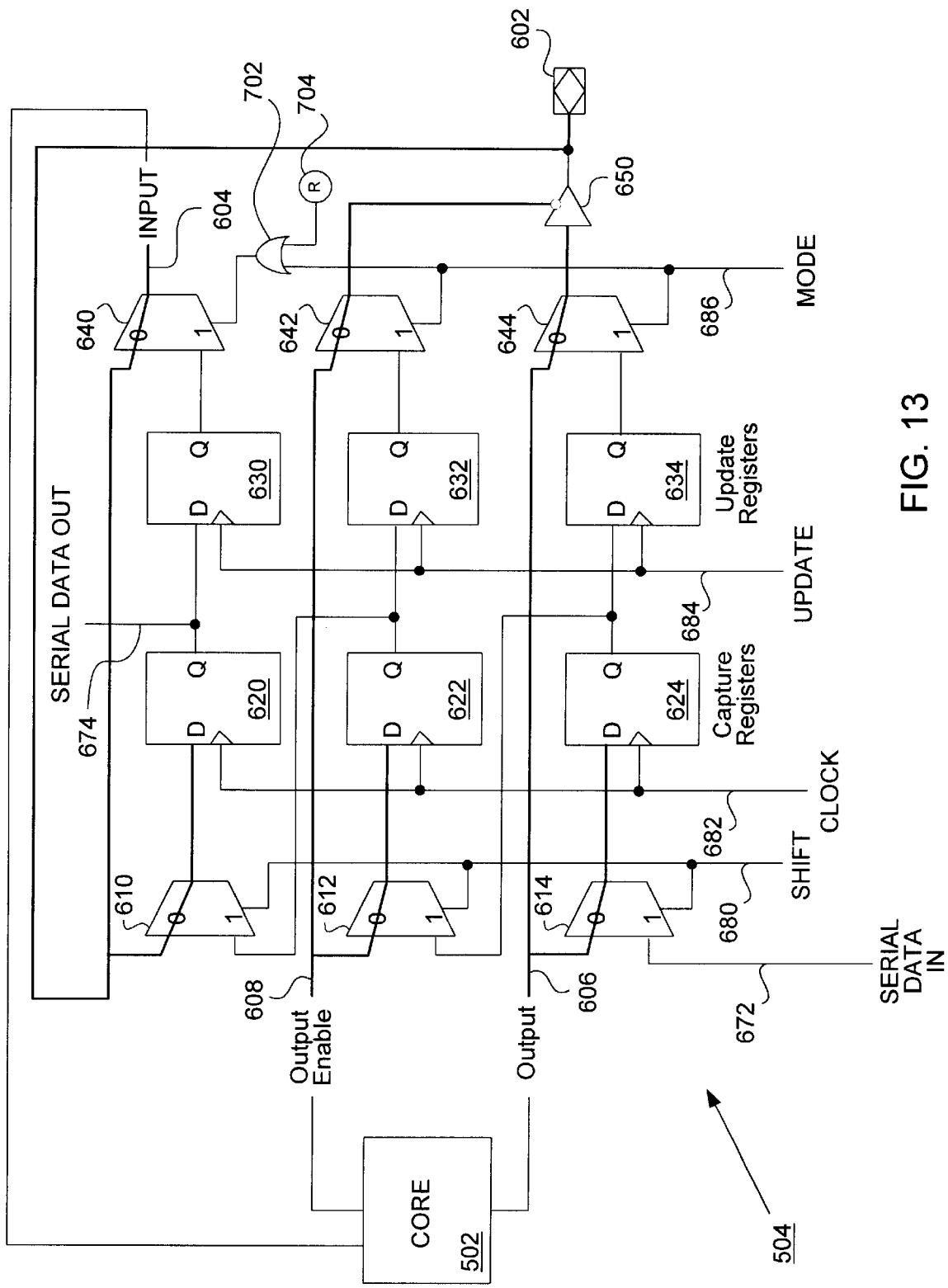
FIG. 13 illustrates a JTAG-enabled I/O cell according to the first embodiment of FIG. 11.

FIG. 13 illustrates an unbonded I/O cell 504 according to this first embodiment of JTAG control. Additionally included in cell 504 is gate 702 and debug RAM bit 704. In this embodiment, mode 686 places PLD 16 into its normal mode of operation so that logic analyzer 260 can capture real-world data. In this mode, pins of the PLD are not isolated from core 502. For unbonded I/O cell 504, however, it is still desirable to be able to use JTAG port 272 to provide a control signal to embedded logic analyzer 260. To these ends, gate 702 and debug RAM bit 704 are provided. Bit 704 is always set; therefore, the output of gate 702 is a logic "1" which directs multiplexer 640 to always produce its output data from update register 630. Data from register 630 had previously been loaded from capture register 620 which received its data originally from serial data in 672 (after JTAG port 272 has caused data to be shifted through the cells). In this fashion, serial data provided by JTAG port 272 is eventually output by multiplexer 640 and serves as input signal 604 to core 502. Input signal 604 may be used to provide either a control signal or a data input signal for logic analyzer 260. Advantageously, the device may be operated in normal mode and all pins that are bonded to I/O cells are still connected to core 502. Furthermore, logic analyzer 260 is allowed to be controlled via JTAG port 272 using the JTAG Sample/Preload instruction that places control information into capture registers 620–624.

Second JTAG Control Embodiment

Figure 14:
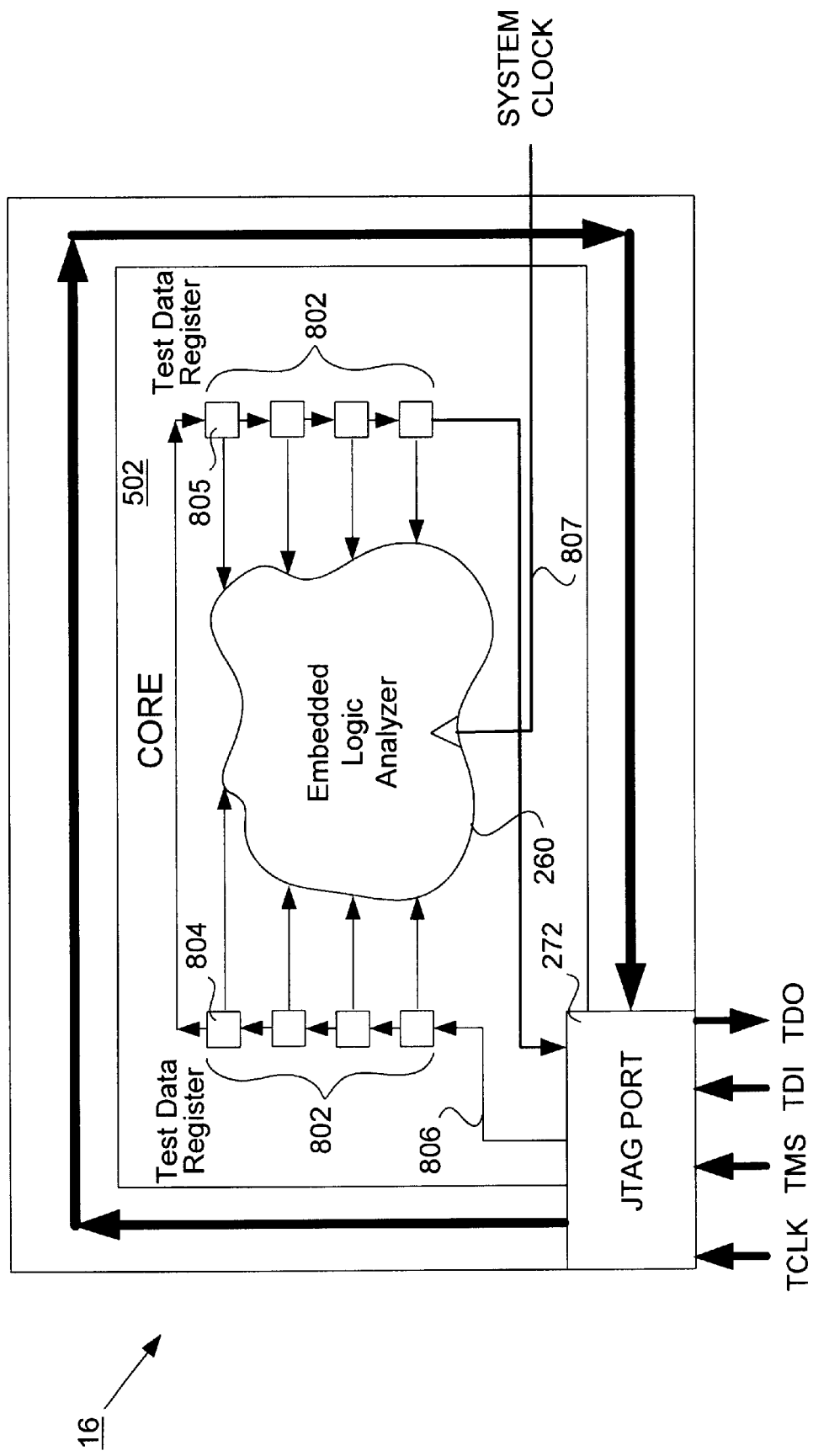
FIG. 14 illustrates a second embodiment by which a JTAG port controls an embedded logic analyzer using a test data register.

FIG. 14 illustrates a second embodiment by which JTAG port 272 controls embedded logic analyzer 260 using a test data register 802. In this embodiment, a user implemented test data register 802 is used to provide control signals to, and to receive data an d status form, logic analyzer 260. This embodiment is particularly useful if no unbonded I/O cells are available. It relies upon extra user-supplied logic in test data register 802 instead of using unbonded I/O cells. In addition, this embodiment provides an extra signal Runtest (user) that allows logic analyzer 260 to know when the JTAG state machine has entered the Runtest state. Register 802 includes any number of stimulus cells 804 used to control logic analyzer 260 and any number of sense cells 805 used for retrieving data and status from the logic analyzer. Control signals 806 include signal TDI(user) which is presented to the first stimulus cell and then shifted through all of the cells. Also included are the control signals Shift(user), Clock(user), Update(user), and Runtest(user); these signals are presented globally to each cell 804 or 805. Signal TDO(user) 807 is received from the from sense cell 805 and presented to JTAG port 272 to become signal TDO.

In this embodiment, control signals TDI(user), Shift (user), Clock(user), and Update(user) are analogous to signals 672, 680, 682 and 684 from the embodiment shown in FIG. 13 except that these control signals in this second embodiment are driven into core 502 instead of being presented to I/O cells. Advantageously, using this uncommon approach of driving JTAG signals directly into the core, control of an embedded logic analyzer is achieved without using extra pins or I/O cells of the PLD (aside from the JTAG port pins). Signal TDO(user) is analogous to signal 674 of the embodiment of FIG. 13 except that signal TDO(user) originates from core 502 instead of from an I/O cell 504.

To implement this embodiment, the netlist of the PLD is augmented to add user-implemented test data register 802. Additionally, each input to and each output from logic analyzer 260 is routed to an element 804 or 805, respectively. To generate a control signal for delivery to logic analyzer 260, a private "Usertest" instruction is scanned in, and then the control information is scanned in and loaded. Finally, the output data from the logic analyzer is scanned out. Further details are provided below.

Figure 15:
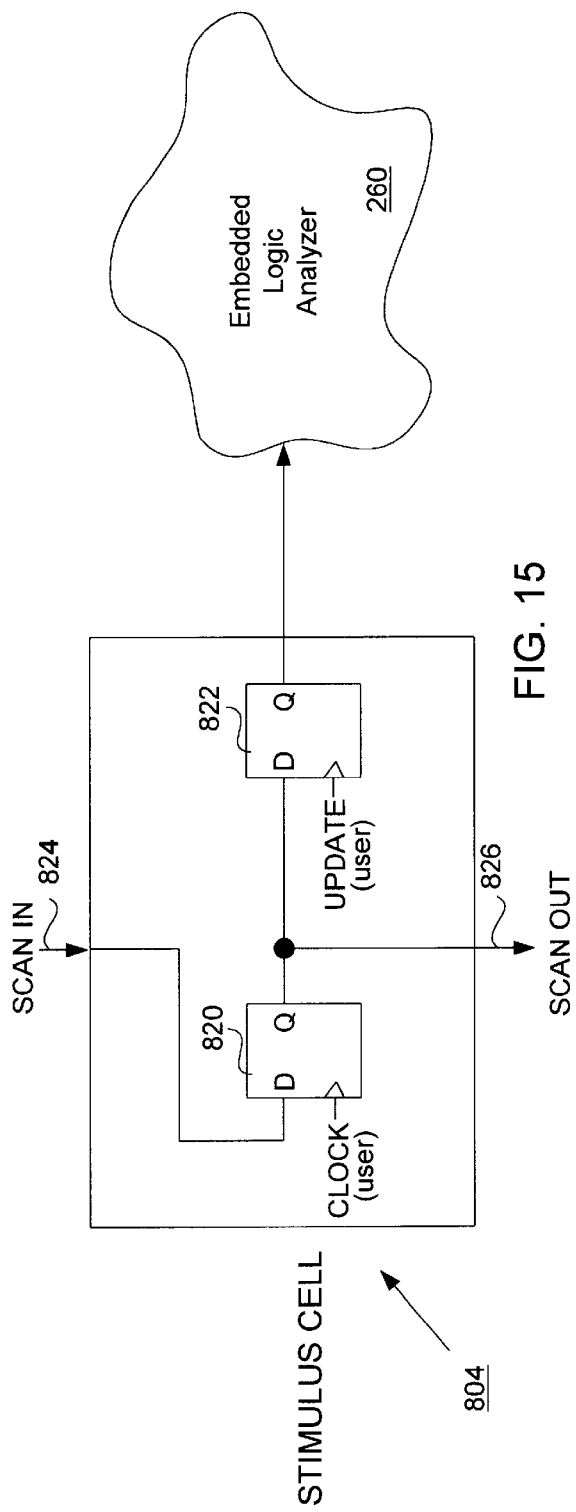
FIG. 15 illustrates a stimulus cell that is an element of the test data register of FIG. 14.

FIG. 15 illustrates a stimulus cell 804 that is an element of test data register 802. Cell 804 includes capture register 820 and update register 822. Scan in signal 824 is received from a previous similar cell or from JTAG port 272 if this is the first stimulus cell. Scan out signal 826 is transmitted to the next stimulus cell or to the first sense cell 805 if this is the last stimulus cell. While a serial shift of information through elements of data register 802 is occurring, information arrives at cell 804 via scan in 824, is captured by register 820 and is shifted out via scan out 826. When a parallel load is performed under control of JTAG port 272, update register 822 transfers the bit stored in register 820 to logic analyzer 260. This transferred bit may then be used as a control signal for the logic analyzer.

Figure 16:
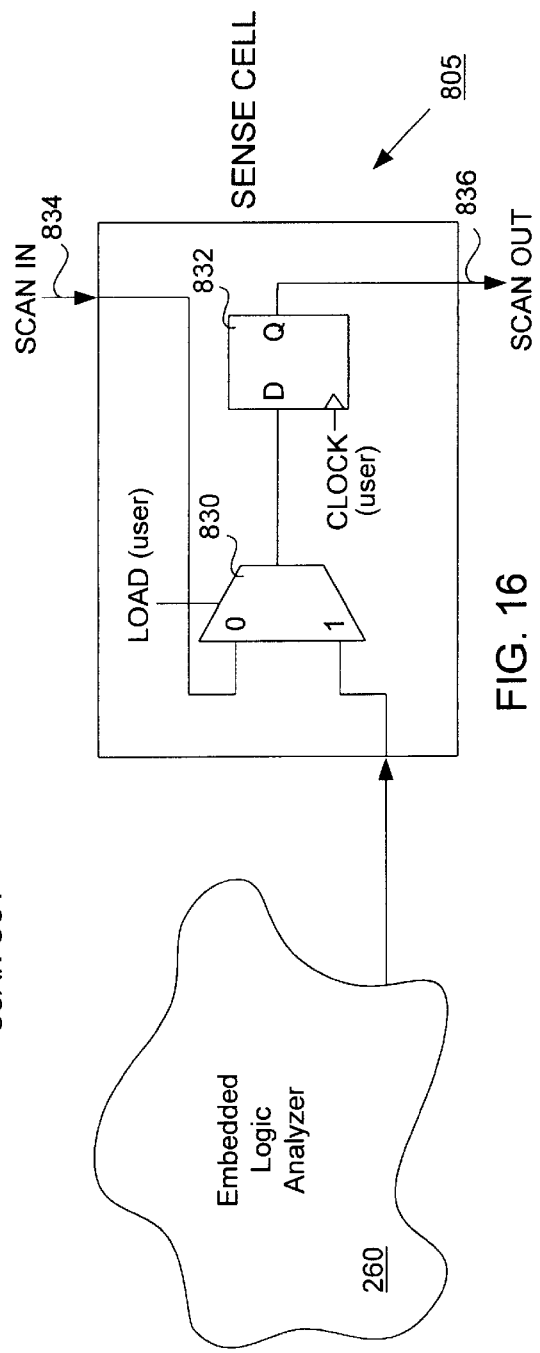
FIG. 16 illustrates a sense cell that is an element of the test data register of FIG. 14.

FIG. 16 illustrates a sense cell 805 that is one element of test data register 802. Cell 805 includes multiplexer 830 and capture register 832. Scan in signal 834 is received from a previous sense cell or from the last stimulus cell 804 if this is the first sense cell. Scan out signal 836 is transmitted to the next sense cell 805 or to JTAG port 272 if this is the last sense cell. During serial scanning of information through test data register 802 signal Load(user) is a zero; scanned in bits arrive via scan in 834, are latched using register 832, and are shifted out via scan out 836. During a parallel load operation (or sense operation), signal Load(user) is a one; data and/or status arrive via multiplexer 830 and are captured by register 832. Once any number of bits are captured by cells 805 after a parallel load, the captured bits are shifted out using the serial shift mode through JTAG port 272 to computer system 18 for analysis. In this fashion, sense cells 805 are used to retrieve data and/or status from logic analyzer 260 and to present the information to a user for analysis.

Further Embodiments

Figure 17A:
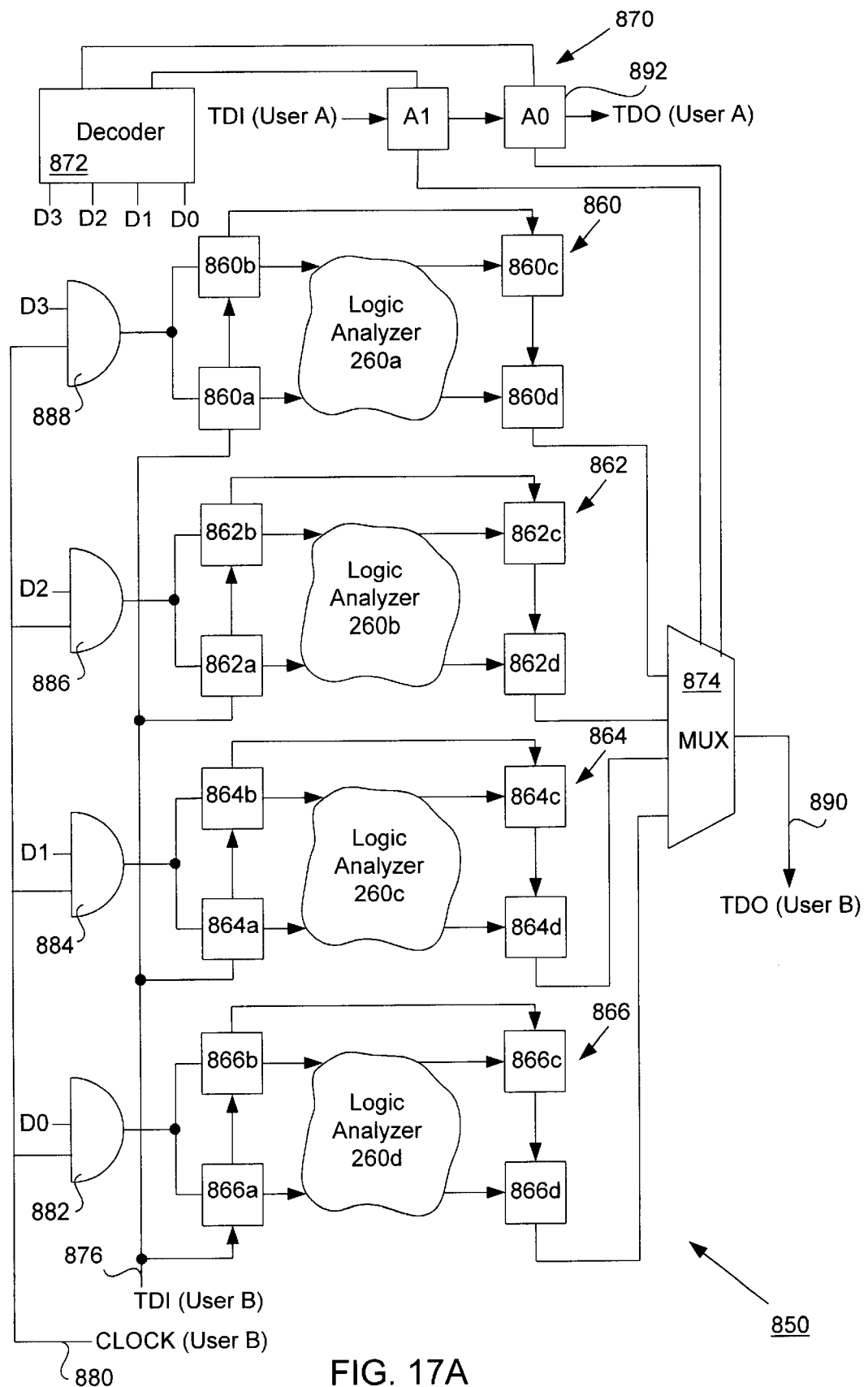
FIGS. 17A and 17B illustrate an alternative embodiment in which any number of logic analyzers embedded within a device are controlled using a JTAG port.
Figure 17B:
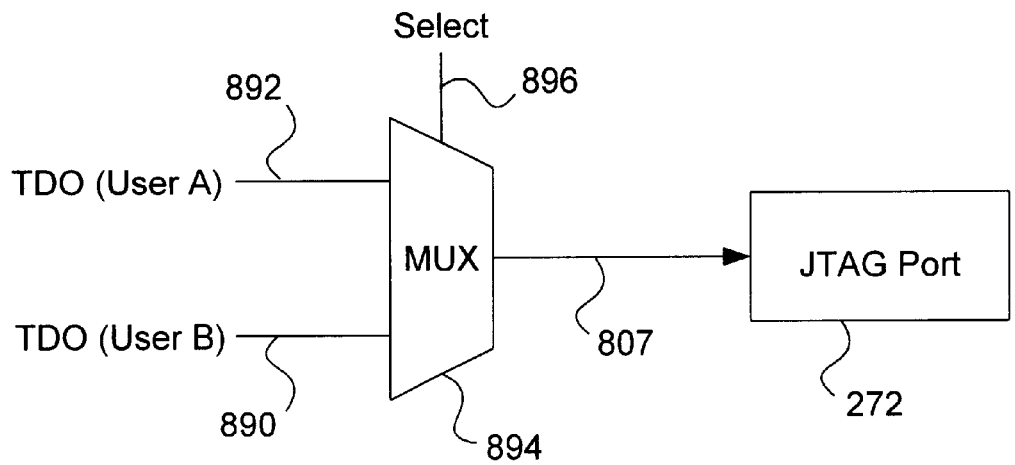

FIGS. 17A, 17B illustrate an alternative embodiment in which any number of logic analyzers embedded within a device are controlled using a JTAG port. As PLDs become larger and larger, it is possible that each megafunction within the device may contain its own embedded logic analyzer. It would be desirable to be able to control any number of embedded logic analyzers using a JTAG port using any of the embodiments discussed herein. In one particular implementation, the second embodiment discussed above in FIGS. 14–16 works well.

Digressing for a moment, it is noted that control of one of two embedded logic analyzers may be achieved using a Select signal generated from JTAG port 272. As is known in the art, private user instructions may be loaded into the JTAG port. In this embodiment, a UserA instruction and a UserB instruction may be provided. Control information destined for a first logic analyzer is loaded into the UserA instruction; control information destined for a second logic analyzer is loaded into the UserB instruction. When UserA is loaded, signal Select goes high, when UserB is loaded, Select goes low. Signal Select is then combined with and qualifies the control signals from the JTAG port to be directed to either a first or a second test data register that control respectively, the first or the second embedded logic analyzer. As is known in the art, a single signal (for example, Select) can enable or disable a control signal for a logic analyzer using a simple combination of AND gates, inverters, etc. For example, when Select is a logic "1", control signals are directed to the first logic analyzer and outputs are received from it. The second logic analyzer is selected when Select is a logic "0". For more than two logic analyzers to be controlled, it is useful to use an embodiment such as will now be described.

FIG. 17A illustrates an embodiment in which logic analyzers 260a, 260b, 260c and 260d present within a single PLD are controlled via a JTAG port of the PLD. Although FIG. 17A provides a simplistic example of control of only four logic analyzers having minimal inputs and outputs, those of skill in the art upon a reading of this disclosure will appreciate how to implement control of any number of logic analyzers, and of logic analyzers having more complex inputs and outputs.

Each logic analyzer 260a–260d is controlled by a respective test data register 860–866. For example, logic analyzer 260a is controlled by test data register 860. Elements 860a and 860b of register 860 provide control inputs to logic analyzer 260a, and elements 860c and 860d of register 860 receive output data from logic analyzer to 260a. The other logic analyzers are controlled in a similar manner.

In this embodiment, two private user instructions within the JTAG port are used to control any number of logic analyzers. The UserA instruction contains an address, suitable for selecting which logic analyzer to control and to receive data from at a particular point in time. The second private instruction called UserB provides the actual control information and receives data from the logic analyzer that is selected using the UserA instruction. The Select signal is also used in this embodiment, and is active depending upon whether information in the UserA or the UserB instruction is being accessed.

Test data register 870 contains two elements Al and AO through which a UserA instruction is shifted in and out. Not shown is a signal Clock(UserA) that is provided to each element. Signal TDO(UserA) 892 returns to JTAG port 272. In this fashion, a UserA instruction provides input to a decoder 872 and to a multiplexer 874 through register 870. Decoder 872 decodes the two bits of register 870 to provide four outputs D3–D0 that are used to control AND gates 882–888. The two bits of register 870 also input to multiplexer 874 to select one of the four logic analyzers for output. In this simplistic example, each logic analyzer has only two inputs and two outputs, and register 870 is only two bits wide. It will be appreciated that each of these registers could be of any size and that more logic analyzers may also be present.

As mentioned earlier, a second private UserB instruction is used to provide the actual control information for the logic analyzer selected by the UserA instruction. Similar to the second embodiment discussed above, signal TDI(UserB) 876 is provided in a serial fashion to each of the test registers 860–866 that control respectively logic analyzers 260a–260d. Serial information received on signal 876 is shifted through the appropriate test data register and eventually is shifted out through multiplexer 874 to become signal TDO(UserB) 890 which is returned to the JTAG port. For example, if logic analyzer 260d were to be selected, control information would be shifted in via signal 876 to element 866a, shifted then to element 866b, then shifted to element 866c and finally shifted to element 866d. In a similar fashion, output data received from logic analyzer 260d is retrieved using a parallel load into elements 866c and 866d and then shifted out to multiplexer 874.

As discussed earlier, the elements within a particular test data register receive numerous control signals such as Shift (user), Clock(user), Update(user), and Runtest(user). These control signals are routed to the selected logic analyzer using decoder 872 and AND gates 882–888. As previously noted, signals Clock(UserB) 880 and Clock(UserA) (not shown) may be generated from signal Clock(user) using AND gates and the signal Select. When Select is active, Clock(UserA) is clocking and Clock(UserB) is not; an inactive Select produces the opposite. In this fashion, when information from private instruction UserA is being supplied, Select is active and enables the appropriate control signals.

In this simplistic example, only the signal Clock(UserB) 880 is shown being routed to the selected logic analyzer. Those of skill in the art will appreciate how the other control signals may also be directed to the selected logic analyzer in a similar fashion. Output from decoder 872 enables only one of four outputs D3–D0 at a time in order to select one of AND gates 882–888. Thus, signal 880 will only be directed to the test data register for the selected logic analyzer at a given point in time. For example, should register 870 contain the value "11", the output D3 of decoder 872 would be active and the other output signals would be low. Thus, only gate 888 would allow signal 880 to pass through to test data register 860 for controlling logic analyzer 260a. The other gates 882–886 would not allow signal 880 to pass through. Other similar forms of selection and control may also be used to route the control signals to the selected logic analyzer.

FIG. 17B illustrates one technique by which signals TDO(UserA) 892 and TDO(UserB) 890 from register 870 and multiplexer 874 are returned to JTAG port 272. Signals 890 and 892 are input to multiplexer 894 and one is selected using signal Select 896. As previously mentioned, Select may be used to qualify and/or select control signals to a logic analyzer, or from a logic analyzer. In this example, if information is being shifted through register 870 Select will be active (which also enables Clock(UserA)) and signal 892 will pass through multiplexer 894 and to port 272. Signal 890 is selected when Select is low. In this fashion, the appropriate output from embodiment 850 is delivered to JTAG port 272 and eventually to the single signal TDO of the JTAG port.

Other similar embodiments may also be used to control numerous logic analyzers. For example, instead of a different test register (such as registers 860–866) being used for each logic analyzer, there may only be one test data register serving all of the logic analyzers. The selection logic used (such as the AND gates and multiplexer of FIG. 17A) would then be placed in-between the logic analyzers and the single test data register, rather than outside of the logic analyzers as shown in the embodiment of FIG. 17A.

For example, input control signals (such as Clock(user), Shift(user), etc.) from the JTAG port would connect directly to the elements of the single test data register. Data from the UserB instruction would be shifted into this test data register to provide control for one of the logic analyzers. Each input element of the test data register would be routed to each logic analyzer and be qualified by an AND gate, or similar selection circuitry. For example, if three bits of control information are to be supplied from the single test data register to four different logic analyzers, there would be four AND gates for each bit of control information (each associated with a logic analyzer) for a total of twelve AND gates (or similar selection logic). To apply a bit of control information to a selected logic analyzer, selection logic similar to register 870 and decoder 872 may be employed. In other words, the private UserA instruction may be used to select which logic analyzer will be controlled. Decoded information from this UserA instruction may then be used to select and/or disable the AND gates for each bit of control information. In this way, a single bit of control information is enabled to reach one selected logic analyzer, but not the others.

In a similar fashion, multiplexers may be employed to select from which logic analyzers an output signal will be accepted for input to the single test data register. For example, a single multiplexer (or similar selection logic) would be used for each element of the test data register that receives output data from the logic analyzer. Routed to this multiplexer are the corresponding data signals from each of the logic analyzers. For example, the least significant data bit from each of the logic analyzers is routed to a single multiplexer that provides output to a single element of the test data register. The multiplexer is controlled via bits from the UserA test data register in a similar fashion as shown in FIG. 17A. A multiplexer would be supplied for each output element of the test data register, and each controlled by the same selection logic.

Other embodiments are also possible. The first embodiment presented above in FIGS. 11–13 or the second embodiment presented above FIGS. 14–16 may be used exclusively to control a logic analyzer or they may be combined to provide control. If a sufficient number of extra unbonded I/O cells are available, it may be desirable to use the first embodiment exclusively. This is especially true if it would be difficult to insert extra logic into the device. If insufficient I/O cells are available, it may be desirable to use the second embodiment, as long as the addition of the extra logic required by test data register 802 is not a problem. Using exclusively the first embodiment, a Clock signal can be provided to the embedded logic analyzer by using input signal 604. To provide this Clock signal, alternating 1's and 0's are shifted into one particular I/O cell and then loaded one at a time to provide an alternating pulse. Each new bit, though, must be scanned in through an entire set of registers before the bit can be provided as a Clock signal. For this reason, this technique of providing a Clock signal to the embedded logic analyzer using the first embodiment is not extremely efficient.

In a more optimal solution, a combination of the first and second embodiments are used. In this solution, the extra signal Runtest(user) available in the second embodiment is used to provide a Clock signal to the embedded logic analyzer. Upon transition of this Clock signal, the logic analyzer is instructed to look at the control signals arriving from input signals 604 of the various I/O cells 504 that have been implemented using the first embodiment. The signal Runtest(user) can be made to provide clock pulses simply by causing JTAG port 272 to enter this state and then back out in an alternating fashion. Using this technique, more efficient control is provided yet extra unbonded I/O cells may still be used to provide the actual control information to the logic analyzer.

Computer System Embodiment

Figure 18:
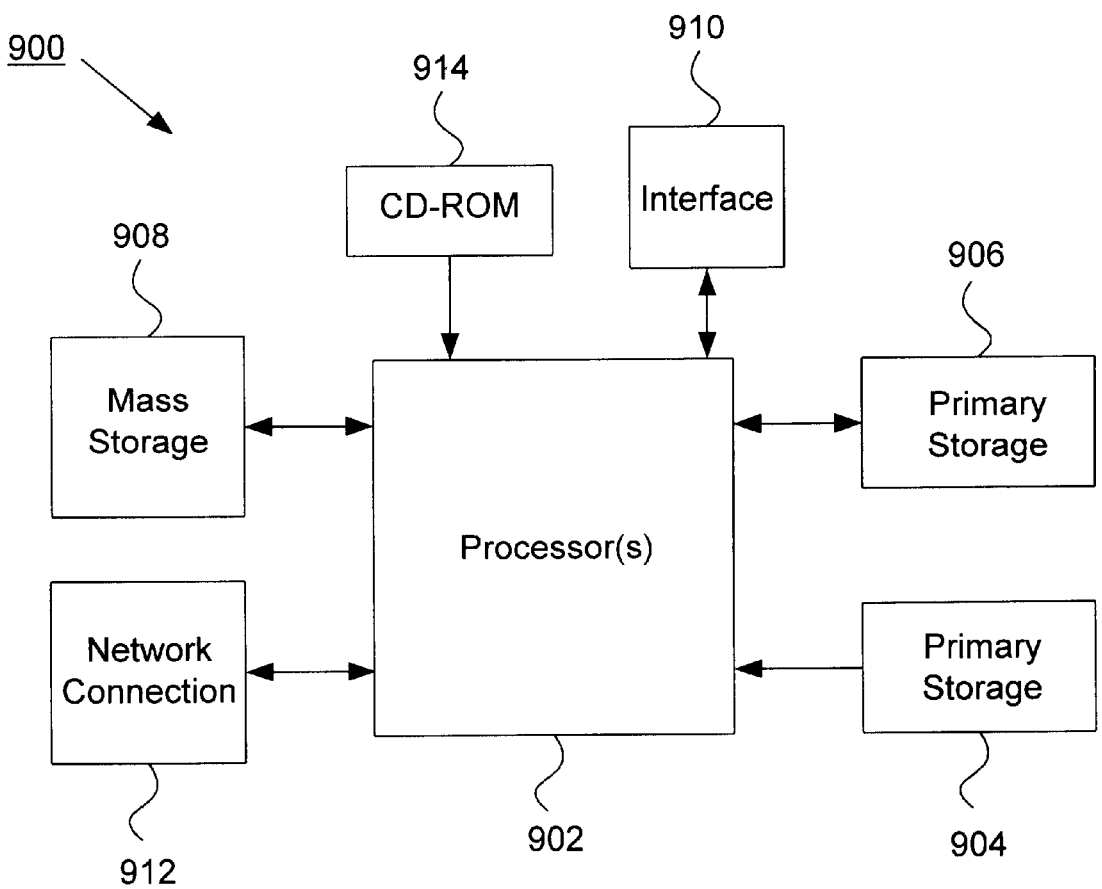
FIG. 18 is a block diagram of a typical computer system suitable for implementing an embodiment of the present invention.

FIG. 18 illustrates a computer system 900 in accordance with an embodiment of the present invention. Computer system 900 includes any number of processors 902 (also referred to as central processing units, or CPUs) that are coupled to storage devices including primary storage 906 (such as random access memory, or RAM) and primary storage 904 (such as a read only memory, or ROM). As is well known in the art, primary storage 904 acts to transfer data and instructions uni-directionally to the CPU and primary storage 906 is used typically to transfer data and instructions in a bi-directional manner. Both of these primary storage devices may include any suitable of the computer-readable media described below. A mass storage device 908 is also coupled bi-directionally to CPU 902 and provides additional data storage capacity and may also include any of the computer-readable media described below. Mass storage device 908 may be used to store programs, data and the like and is typically a secondary storage medium (such as a hard disk) that is slower than primary storage. It will be appreciated that the information retained within mass storage device 908, may, in appropriate cases, be incorporated in standard fashion as part of primary storage 906 as virtual memory. A specific mass storage device such as a CD-ROM 914 passes data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, biometrics readers, or other computers. CPU 902 optionally may be coupled to another computer or telecommunications network using a network connection as shown generally at 912. With such a network connection, it is contemplated that the CPU might receive information from the network, or might output information to the network in the course of performing the above-described method steps.

In addition, embodiments of the present invention further relate to computer storage products with a computer readable medium that have program code thereon for performing various computer-implemented operations. The media and program code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. For instance, a logic analyzer may be embedded in any suitable device or circuit board that lends itself to being programmed. Also, the present invention is applicable to any type of EDA tool that is able to compile a user design. Although only one example of compilation of a logic analyzer is presented, variations on this compile technique may occur depending upon the device for which the design is being compiled and still take advantage of the present invention. Furthermore, the specific logic analyzer circuit shown is exemplary; other circuits may also be used to implement a logic analyzer. An interface to the logic analyzer from a computer may use any number of pins and any type of protocol such as serial, parallel, etc. A JTAG port may control one or more embedded logic analyzers using either the first or second control embodiments described, or a combination of the two. Therefore, the described embodiments should be taken as illustrative and not restrictive, and the invention should not be limited to the details given herein but should be defin by the following claims and their full scope of equivalents.

We claim:

1. An electronic design automation (EDA) software tool used to program a programmable logic device (PLD), said EDA tool comprising:

a user electronic design intended for said PLD;

an indication of internal signals of said electronic design to monitor;

an indication of a breakpoint that specifies the state of at least one signal within said electronic design;

an indication of a number of samples of said internal signals to be captured before said breakpoint;

a logic analyzer design arranged to store said samples from said electronic design in a memory of said logic analyzer such that said samples are stored before the occurrence of said breakpoint; and a compiler arranged to compile said user electronic design and said logic analyzer design into an output file, whereby said PLD is programmed with said output file.

2. An EDA software tool as recited in claim 1 further comprising:

a display that allows said samples retrieved from said logic analyzer to be displayed on said EDA tool, whereby said PLD is debugged.

3. An EDA software tool as recited in claim 1 wherein said logic analyzer design is stored within said EDA tool or is generated when needed.

4. A method for reprogramming a programmable logic device (PLD) in a system, said method comprising:

receiving an electronic design intended for said PLD;

specifying internal signals of said electronic design to monitor;

specifying a first breakpoint;

compiling said electronic design with said internal signals, said first breakpoint and a logic analyzer to produce a first design file;

programming said PLD with said first design file, said logic analyzer being embedded in said PLD and arranged to store said internal signals before occurrence of said first breakpoint;

specifying a second breakpoint;

recompiling said electronic design with said internal signals, said second breakpoint and said logic analyzer to produce a second design file; and reprogramming said PLD with said second design file, said logic analyzer being embedded in said PLD and arranged to store said internal signals before occurrence of said second breakpoint, whereby said PLD is reprogrammed while in said system.

5. A method as recited in claim 4 further comprising:

specifying a second set of internal signals of said electronic design to monitor;

recompiling said electronic design with said second set of internal signals, said first breakpoint and said logic analyzer to produce a third design file;

reprogramming said PLD with said third design file, said logic analyzer being embedded in said PLD and arranged to store said second set of internal signals before occurrence of said first breakpoint.

6. A method for receiving sample data from a logic analyzer embedded within a programmable logic device (PLD), said method comprising:

establishing communication with a logic analyzer embedded within a programmable logic device (PLD);

specifying a breakpoint indicative of the state of at least one signal within said PLD;

indicating to said logic analyzer to continuously store internal signals of said PLD in a memory of said logic analyzer such that said internal signals are stored before the occurrence of said breakpoint; and receiving said stored internal signals from said logic analyzer, said stored signals representing at least signals stored before said breakpoint, whereby said stored internal signals may be viewed on a user computer.

7. A method as recited in claim 6 further comprising:

determining total number of samples to be captured and number of samples to be captured after said breakpoint; and communicating said total number of samples to be captured and said number of samples to be captured after said breakpoint to said logic analyzer, whereby once said breakpoint occurs said logic analyzer continues to capture samples equal to said number of samples to be captured after said breakpoint.

8. A method as recited in claim 6 wherein said steps of specifying, indicating and receiving make use a JTAG port of said PLD.

9. A programmable logic device (PLD) comprising:

PLD circuitry representing one iteration of an electronic design in a design process to create a final PLD;

logic analyzer circuitry integrated within said PLD circuitry such that a portion of said PLD circuitry is connected to said logic analyzer circuitry;

a state machine within said logic analyzer circuitry for initiating the capture of signals from said PLD circuitry before a breakpoint occurs; and sample memory circuitry within said logic analyzer circuitry arranged to capture said signals before said breakpoint occurs, whereby said sample memory circuitry is available to present said captured signals for analysis after said capture.

10. A programmable logic device (PLD) as recited in claim 9 wherein said logic analyzer circuitry continues the capture of signals from said PLD circuitry after said breakpoint occurs, said sample memory circuitry being further arranged to capture said signals after said breakpoint occurs, whereby said sample memory circuitry is available to present said captured signals for analysis after said capture.

11. A programmable logic device as recited in claim 9 wherein said sample memory circuitry includes a ring buffer that overwrites earlier stored signals when full, whereby signals stored before said breakpoint are made available for later analysis.

12. A programmable logic device as recited in claim 9 further comprising:

a JTAG port in communication with said logic analyzer, said JTAG port used to receive said breakpoint and an indication of said signals from a user computer, said JTAG port further used to present said captured signals for analysis to said user computer.

* * * * *